United States Patent
Chen

(10) Patent No.: US 11,282,669 B2
(45) Date of Patent: Mar. 22, 2022

(54) CARRIER DEVICE AND CARRIER KIT

(71) Applicant: Materials Analysis Technology Inc., Hsinchu County (TW)

(72) Inventor: Hung-Jen Chen, Hsinchu (TW)

(73) Assignee: Materials Analysis Technology Inc., Hsinchu County (TW)

( * ) Notice: Subject to any disclaimer, the term of this patent is extended or adjusted under 35 U.S.C. 154(b) by 0 days.

(21) Appl. No.: 17/026,317

(22) Filed: Sep. 21, 2020

(65) Prior Publication Data

US 2022/0013325 A1 Jan. 13, 2022

(30) Foreign Application Priority Data

Jul. 10, 2020 (TW) .................................. 109123376

(51) Int. Cl.
 *H01J 37/20* (2006.01)
(52) U.S. Cl.
 CPC .................................... *H01J 37/20* (2013.01)
(58) Field of Classification Search
 CPC .......... H01J 49/161; H01J 49/24; H01J 49/40
 See application file for complete search history.

(56) References Cited

U.S. PATENT DOCUMENTS

| | | | |
|---|---|---|---|
| 9,778,151 B2 * | 10/2017 | Chang | ............... H01J 37/32009 |
| 10,416,050 B2 * | 9/2019 | Tai | ........................... G01N 1/28 |
| 2012/0298883 A1 * | 11/2012 | Grogan | .................... H01J 37/20 |
| | | | 250/440.11 |
| 2014/0042318 A1 * | 2/2014 | Yaguchi | .................. H01J 37/26 |
| | | | 250/311 |
| 2017/0176298 A1 * | 6/2017 | Chang | ..................... G02B 5/003 |
| 2017/0278670 A1 * | 9/2017 | Damiano, Jr. | .......... H01J 37/16 |
| 2017/0292927 A1 * | 10/2017 | Chang | .................... B01L 3/5027 |
| 2018/0095015 A1 * | 4/2018 | Chen | ........................ G01N 1/06 |
| 2018/0277336 A1 * | 9/2018 | Iwahori | .................... H01J 37/20 |

FOREIGN PATENT DOCUMENTS

| | | |
|---|---|---|
| JP | 200040483 A | 2/2000 |
| JP | 201745564 A | 3/2017 |
| TW | 201903812 A | 1/2019 |
| WO | WO2014013709 A1 | 1/2014 |

* cited by examiner

*Primary Examiner* — David A Vanore
(74) *Attorney, Agent, or Firm* — Li & Cai Intellectual Property Office

(57) ABSTRACT

A carrier device and a carrier kit are provided. The carrier kit includes the carrier device and a specimen carrier. The carrier device carries the specimen carrier and is configured to be fixedly disposed on a specimen holder. The specimen carrier has two observation grooves and a containing channel that is formed therein, and the two observation grooves are configured to expose a part of the containing channel. The carrier device has a containing groove that is recessed on a side of a main body and an observation port. When the specimen carrier is disposed in the containing groove, one of the observation grooves is exposed from the main body through the observation port. At least one limiting element is configured to limit a range of movement of the specimen carrier disposed in the containing groove relative to the main body.

24 Claims, 39 Drawing Sheets

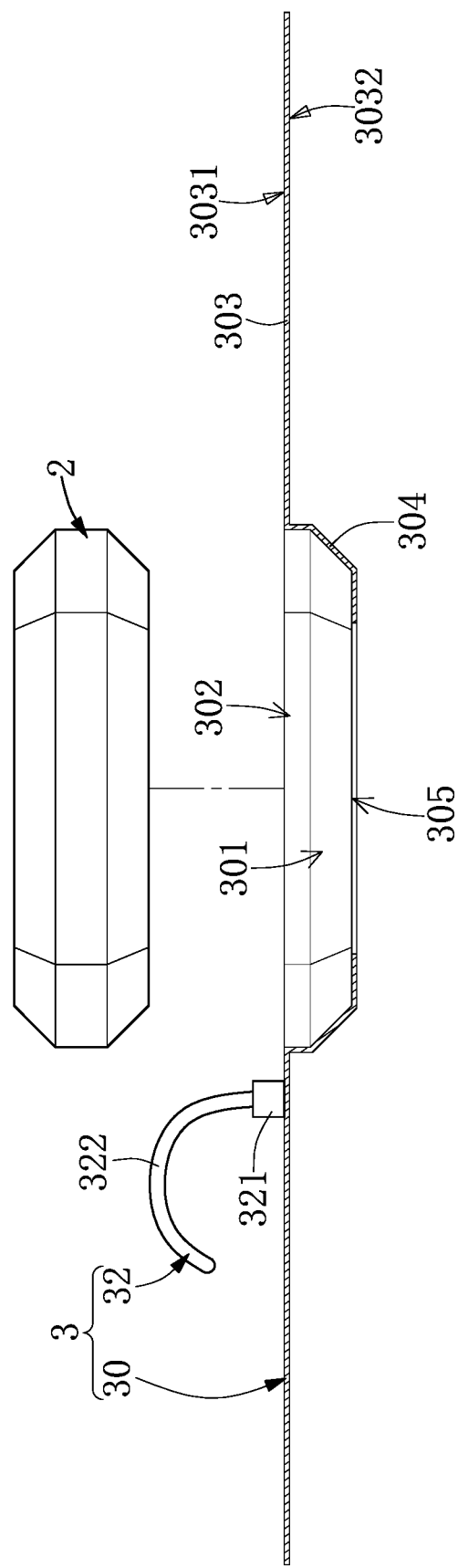
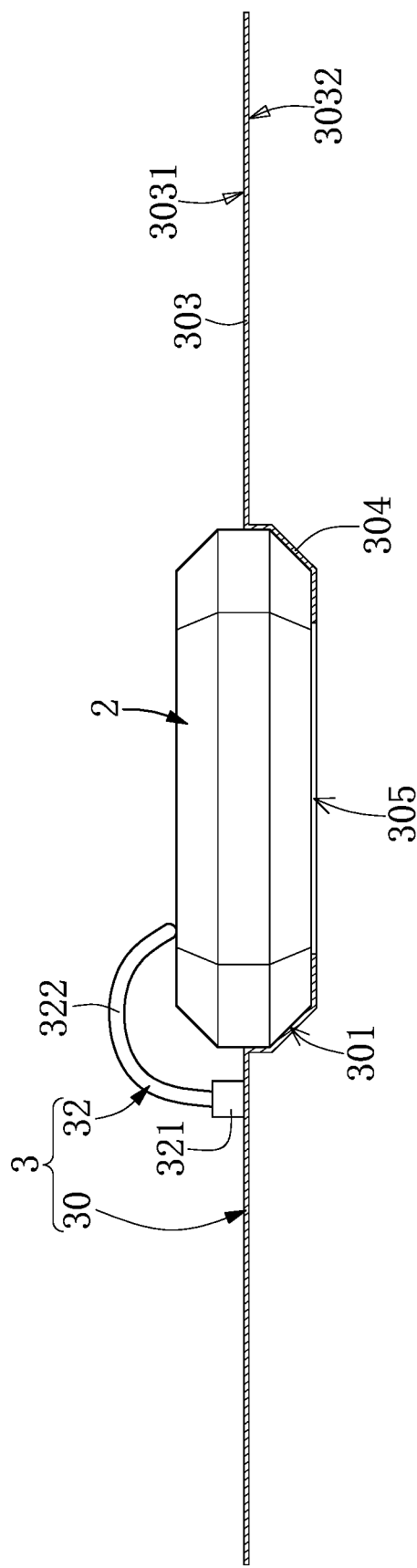

CARRIER DEVICE AND CARRIER KIT

CROSS-REFERENCE TO RELATED PATENT APPLICATION

This application claims the benefit of priority to Taiwan Patent Application No. 109123376, filed on Jul. 10, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a carrier device and a carrier kit, and more particularly to a carrier device being configured to carry a specimen carrier and being disposed on a specimen holder of an electron microscope equipment and a carrier kit including the carrier device and the specimen carrier.

BACKGROUND OF THE DISCLOSURE

Conventional electron microscope equipment, such as a transmission electron microscope (TEM), a scanning tunneling electron microscope (STM), a scanning transmission electron microscope (STEM), or a high-resolution transmission electron microscope (HRTEM), is configured to dispose a specimen to be observed on a copper grid. The copper grid is disposed on a specimen holder, and the specimen holder is then disposed on the electron microscope equipment to observe the specimen on the copper grid through an electron-beam relevant to the specimen.

The observation manner mentioned above is unable to observe a liquid specimen. For this reason, an element that can be configured to carry the liquid specimen is provided. The element must be fixed on a copper ring through the use of glue and be disposed on the specimen holder with the copper ring, so that a user is able to observe the liquid specimen.

Although the element mentioned above is able to solve the problem that the conventional copper grid is unable to be used to observe the liquid specimen, the process of using glue to fix the element on the copper ring will likely cause problems such as glue contamination of the specimen or glue contamination of the element.

SUMMARY OF THE DISCLOSURE

In response to the above-referenced technical inadequacies, the present disclosure provides a carrier device and a carrier kit.

In one aspect, the present disclosure provides a carrier device that is configured to be fixedly disposed on a specimen holder of electron microscope equipment and be configured to carry a specimen carrier, in which the specimen carrier has two observation grooves respectively recessed on two opposite sides thereof and a containing channel that is formed therein and is configured to receive a specimen, and each of the two observation grooves is configured to expose a part of the containing channel, the carrier device includes a main body and at least one limiting element. The main body has a containing groove recessed on a side thereof and an observation port that is in spatial communication with the containing groove, in which the containing groove is configured to receive the specimen carrier, and in which when the specimen carrier is disposed in the containing groove, one of the observation grooves is exposed from the main body through the observation port. The at least one limiting element is disposed on the main body, in which the limiting element is configured to limit a range of movement of the specimen carrier disposed in the containing groove relative to the main body.

In another aspect, the present disclosure provides a carrier kit. The carrier kit includes a specimen carrier and a carrier device. The specimen carrier has two observation grooves respectively formed by being recessed on two opposite sides thereof and a containing channel that is formed therein and is configured to receive a specimen, and each of the two observation grooves is configured to expose a part of the containing channel. The carrier device is configured to be fixedly disposed on a specimen holder of electron microscope equipment and is configured to carry the specimen carrier. The carrier device includes a main body and at least one limiting element. The main body has a containing groove recessed on a side thereof and an observation port that is in spatial communication with the containing groove, in which the containing groove is configured to receive the specimen carrier, and in which when the specimen carrier is disposed in the containing groove, one of the observation grooves is exposed from the main body through the observation port. The at least one limiting element is disposed on the main body, in which the at least one limiting element is configured to limit a range of movement of the specimen carrier disposed in the containing groove relative to the main body.

Therefore, the carrier device and the carrier kit of the present disclosure allows the specimen carrier to be stably fixed on the main body without using glue through the design of the main body and the at least one limiting element. Accordingly, the carrier device and the carrier kit of the present disclosure can solve the problems in the conventional technology, such as the glue contamination of the specimen or the glue contamination of the element that is likely to occur and interfere with the specimen observation when the glue is used to fix the element configured to carry the liquid specimen.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 18 and FIG. 19 are schematic views showing a process of a specimen carrier (non-sectional) being disposed in a carrier device (sectional) according to a fifth embodiment of the present disclosure.

DETAILED DESCRIPTION OF THE EXEMPLARY EMBODIMENTS

Figure 1:
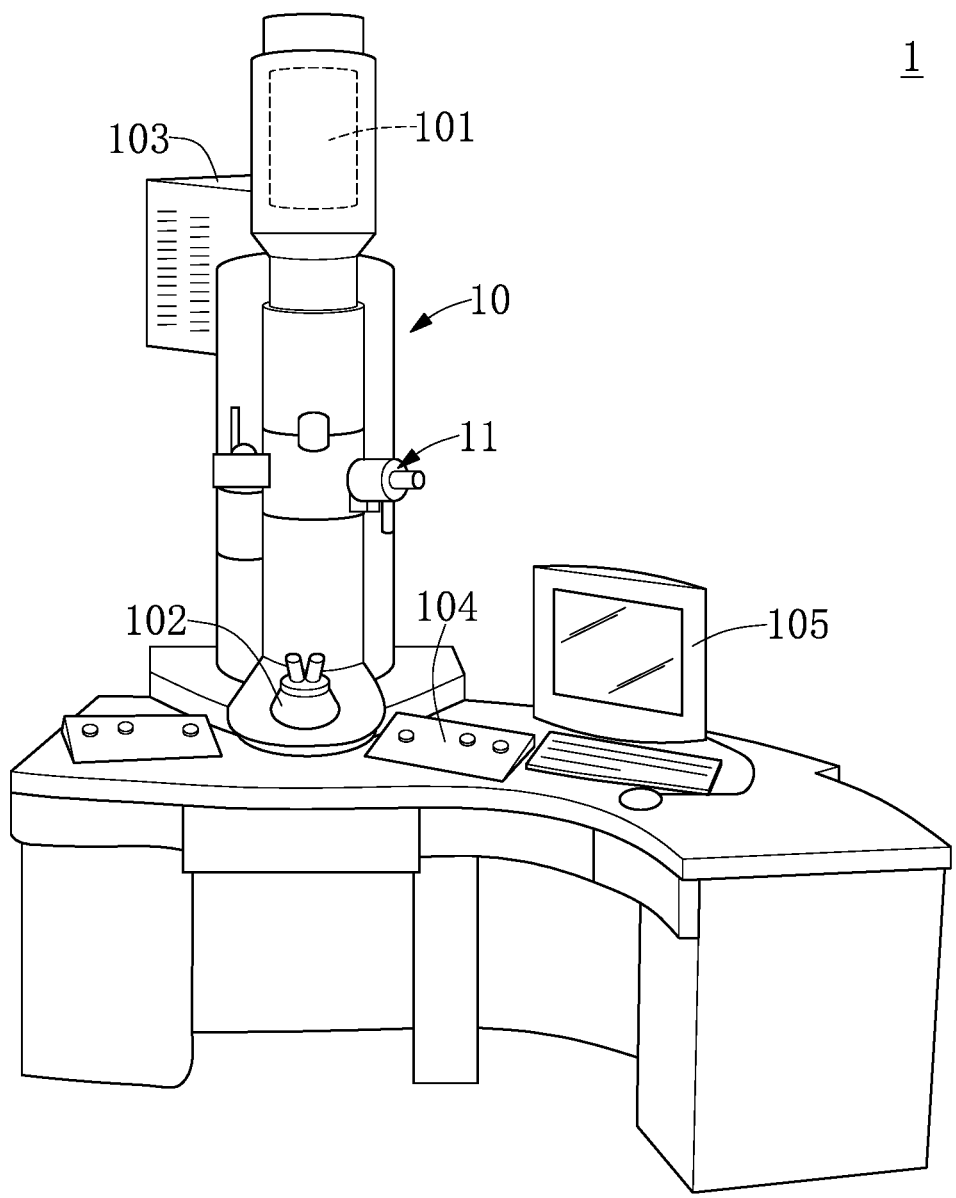
FIG. 1 is a schematic view of an electron microscope equipment.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
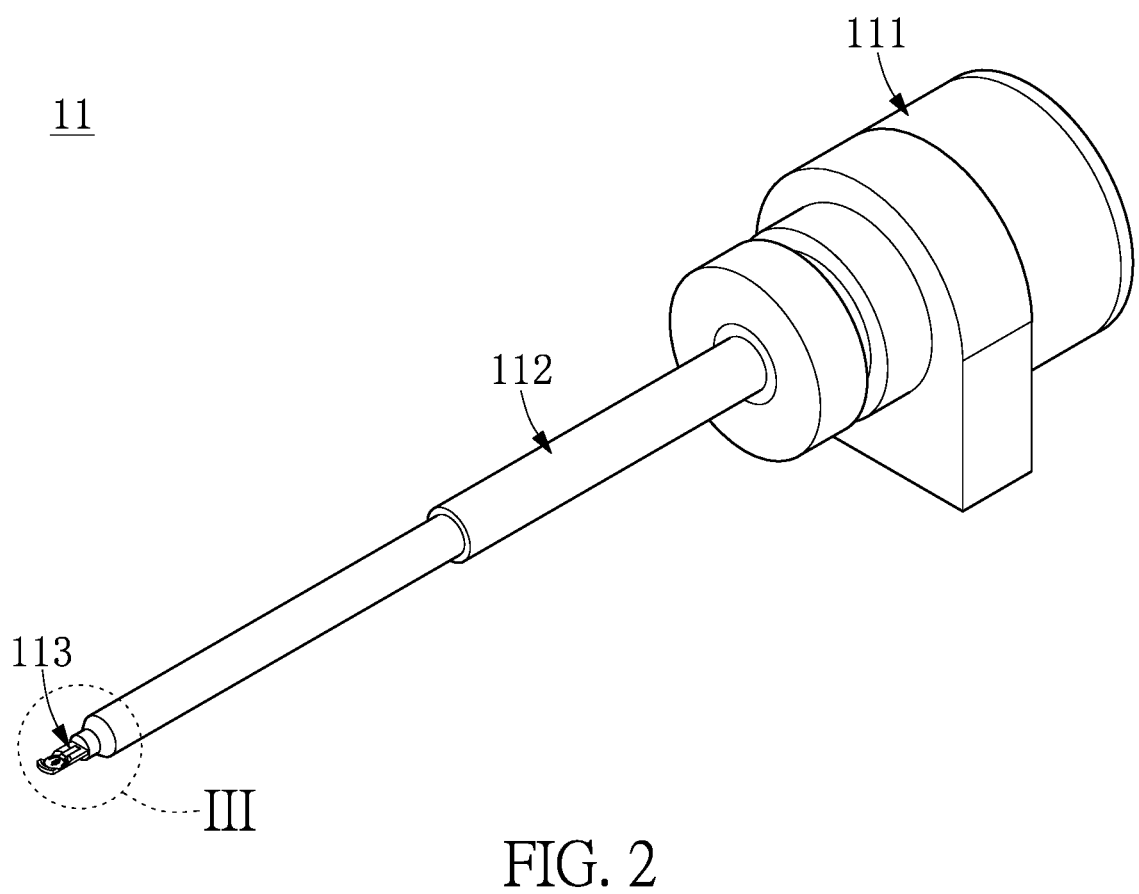
FIG. 2 is a schematic view of a specimen holder of the electron microscope equipment.
Figure 3:
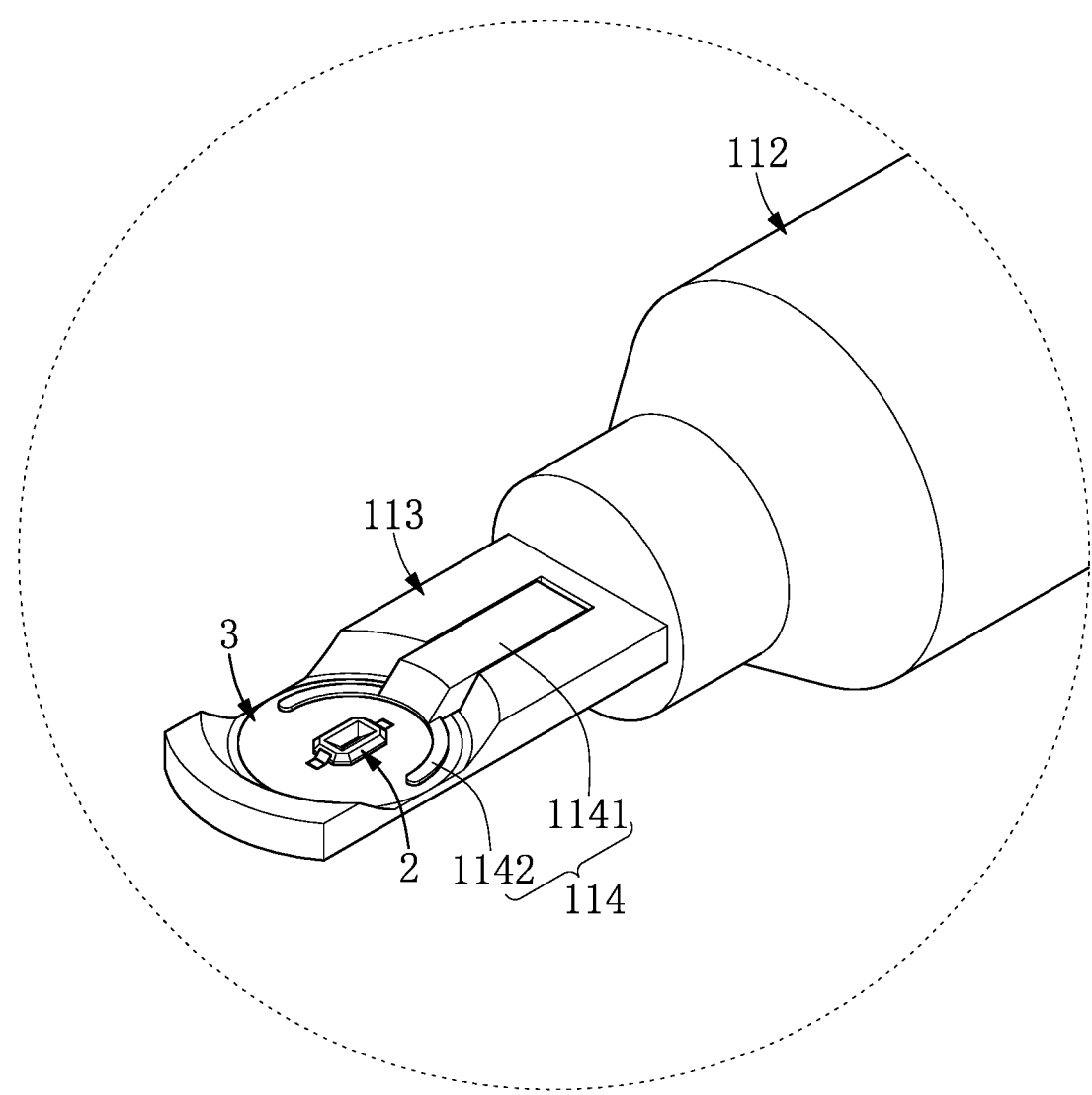
FIG. 3 is a schematic view of a carrier kit of the present disclosure being disposed on the specimen holder of the electron microscope equipment.
Figure 4:
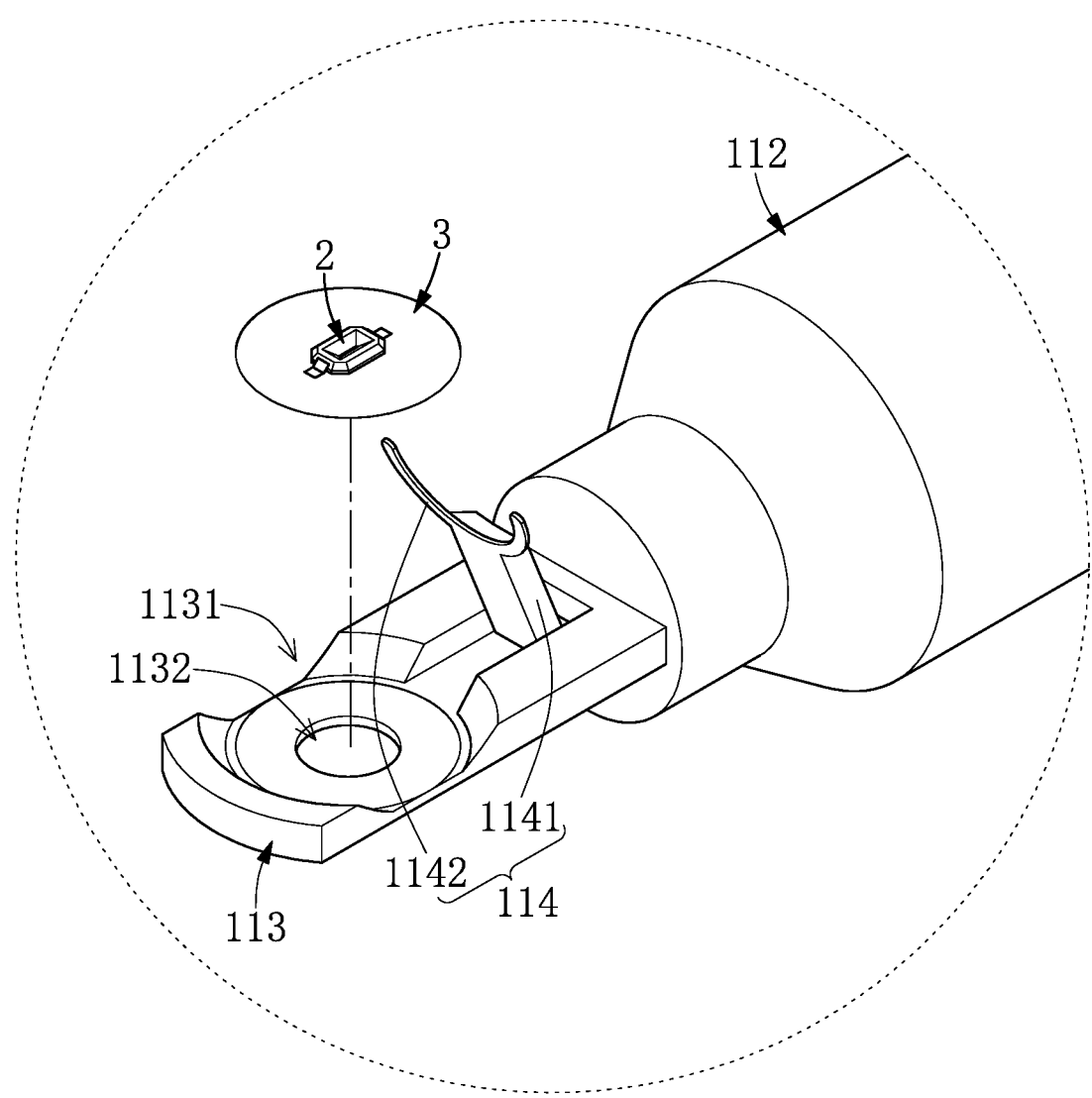
FIG. 4 is an exploded view of the carrier kit according to a first embodiment of the present disclosure and the specimen holder of the electron microscope equipment.

Referring to FIG. 1 to FIG. 4, FIG. 1 is a schematic view of an electron microscope equipment, FIG. 2 is a schematic view of a specimen holder of the electron microscope equipment, and FIG. 3 and FIG. 4 are respectively an assembled view of a specimen holder of the electron microscope equipment carrying a carrier kit of the present disclosure and an exploded view thereof.

The electron microscope equipment 1 includes an equipment body 10 and a specimen holder 11. In the following description, only parts of components of the equipment body 10 will be described. The other parts of the equipment body 10 undescribed are the same as the entire mechanisms and electronic components of conventional electron microscope equipment, such as a transmission electron microscope (TEM), a scanning tunneling electron microscope (STM), a scanning transmission electron microscope (STEM), or a high-resolution transmission electron microscope (HR-TEM). Accordingly, the other parts of the equipment body 10 undescribed are omitted herein for the sake of brevity.

The equipment body 10 includes an electron beam emitter 101, an observation device 102, a processing device 103, a plurality of inputting devices 104, and a display device 105. The electron beam emitter 101 is configured to emit an electron beam, the observation device 102 is configured to allow a user to observe a specimen carried through a specimen carrier 2 that is disposed on a specimen holder 11 of the equipment body 10. The processing device 103 is electrically connected to the electron beam emitter 101 and is configured to control the electron beam emitter 101 to emit the electron beam.

The inputting device 104 is electrically connected to the processing device 103 and is configured to allow the user to operate to control the actions of related mechanisms or electronic components in the equipment body 10 through the processing device 103. The display device 105 is configured to display an image corresponding to the specimen carried through the specimen carrier 2 that is disposed on the specimen holder 11 of the equipment body 10.

As shown in FIG. 2 to FIG. 4, the specimen holder 11 includes a gripping portion 111, a rod body 112, a carrying end 113, and a restricting element 114. The gripping portion 111 of the specimen holder 11 is configured to allow the user to grip onto the gripping portion 111, and the gripping portion 111 is connected to the rod body 112. The carrying end 113 is located at an end of the rod body 112 opposite to an end thereof that is connected to the gripping portion 111. More specifically, the rod body 112 of the specimen holder 11 and the carrying end 113 can be mounted on the equipment body 10.

As shown in FIG. 3 and FIG. 4, the carrying end 113 has a recess 1131 and a through hole 1132, the recess 1131 is configured to dispose the carrier device 3 of the present disclosure therein and is configured to dispose a standard copper gird therein. The restricting element 114 is movably disposed on the carrying end 113 and is configured to be operated to selectively abut against the carrier device 3 in the recess 1131. The through hole 1132 penetrates the carrying end 113 and is in spatial in communication with the recess 1131. More specifically, the restricting element 114 includes a moving portion 1141 and an abutting structure 1142 connected to the moving portion 1141, and the abutting structure 1142 is configured to be rotatably disposed on the carrying end 113 through the moving portion 1141.

The abutting structure 1142 is configured to rotate toward or away from the recess 1131 through the moving portion 1141, so as to abut against the carrier device 3 in the recess 1131 or depart from the carrier device 3 disposed in the recess 1131. A shape of the abutting structure 1142, for example, can be in a C shape, but it is not limited thereto. For example, the abutting structure 1142 can also be in a round shape. Furthermore, the abutting structure 1142 referred to herein can be in various structures used to abut against a copper grid on various conventional specimen rods according to requirements.

Figure 5:
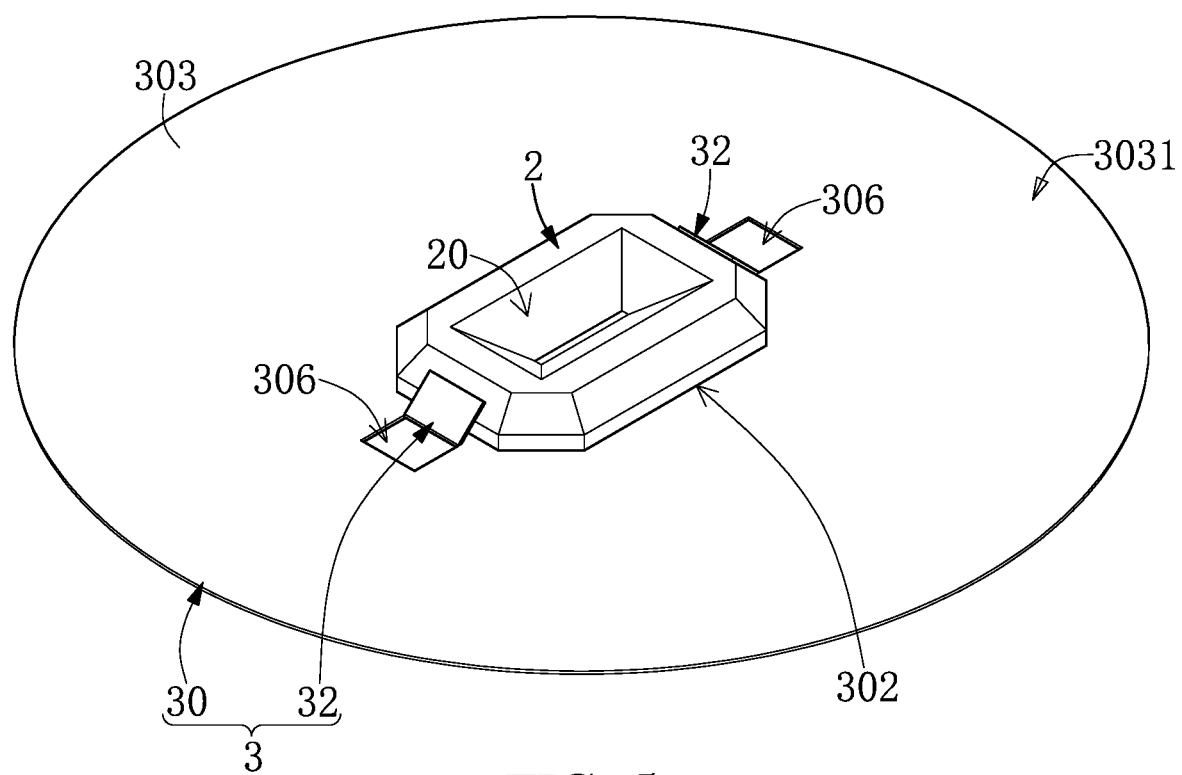
FIG. 5 is an assembled view of the carrier device carrying the specimen carrier according to the first embodiment of the present disclosure.
Figure 6:
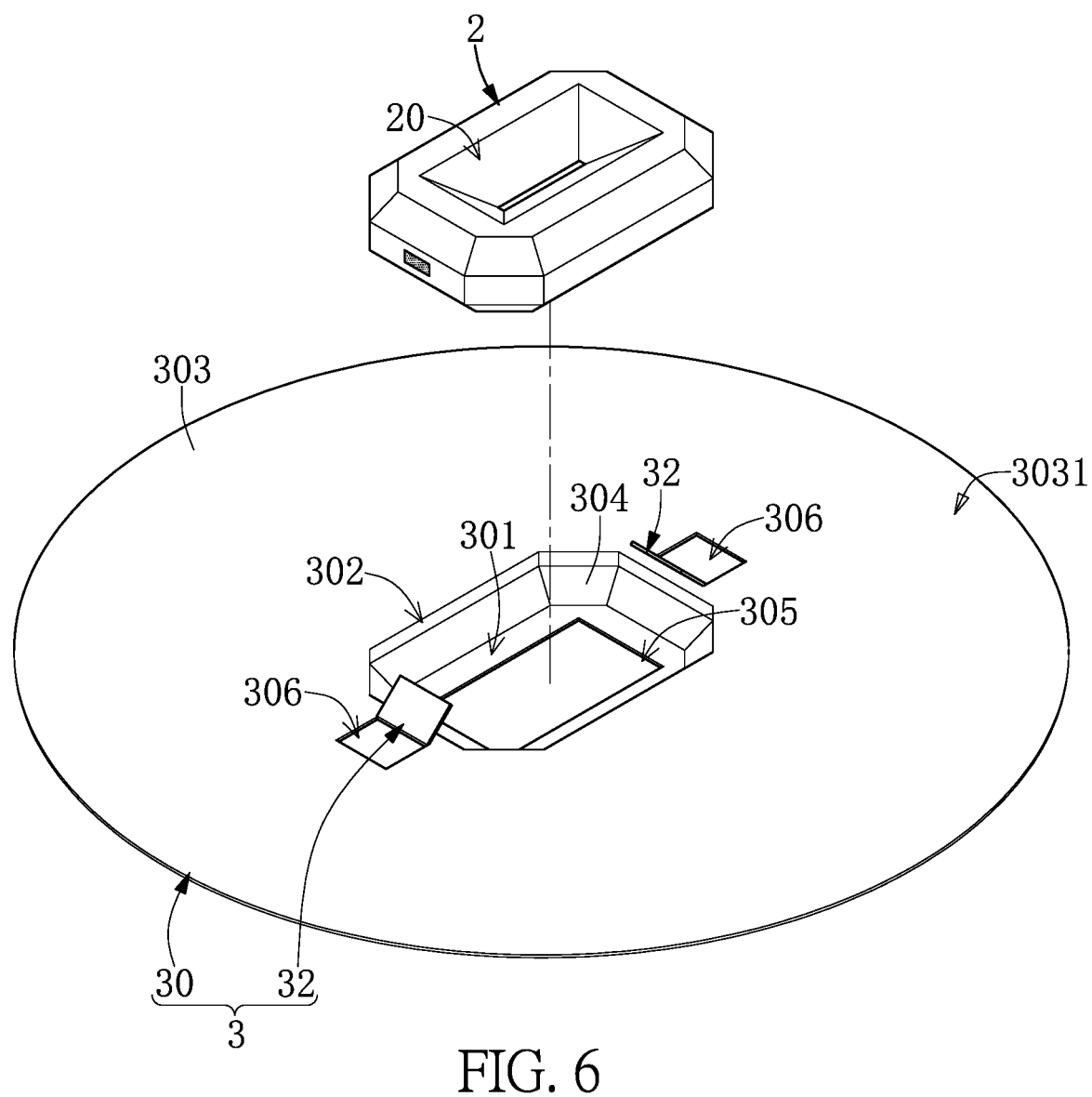
FIG. 6 is an exploded view of the carrier device carrying the specimen carrier according to the first embodiment of the present disclosure.
Figure 7:
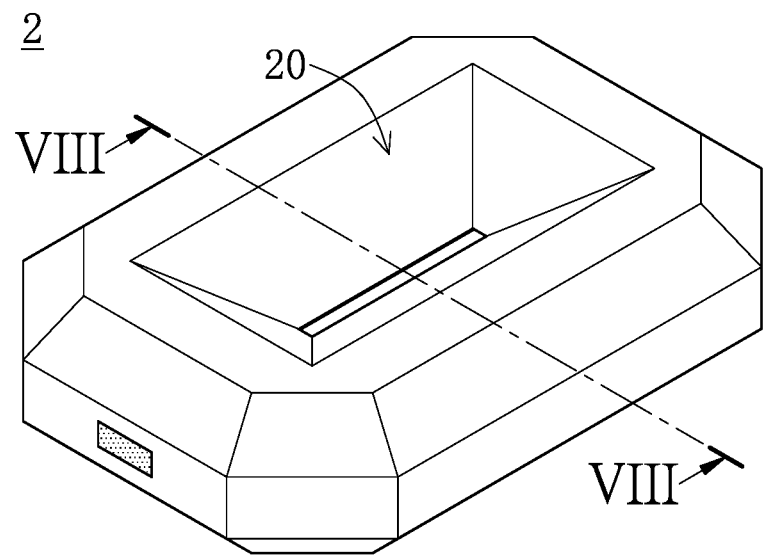
FIG. 7 is a perspective view of the specimen carrier of the carrier kit of the present disclosure.
Figure 8:
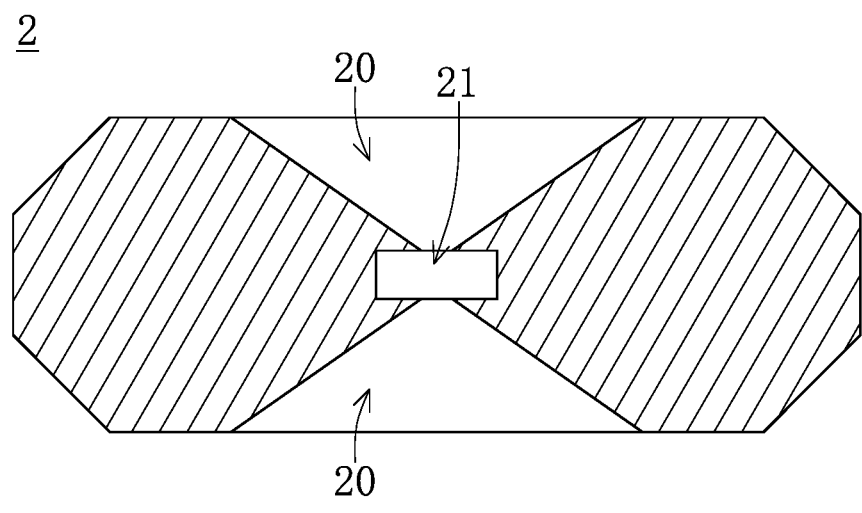
FIG. 8 is a sectional view of the specimen carrier of the carrier kit of the present disclosure.
Figure 9:
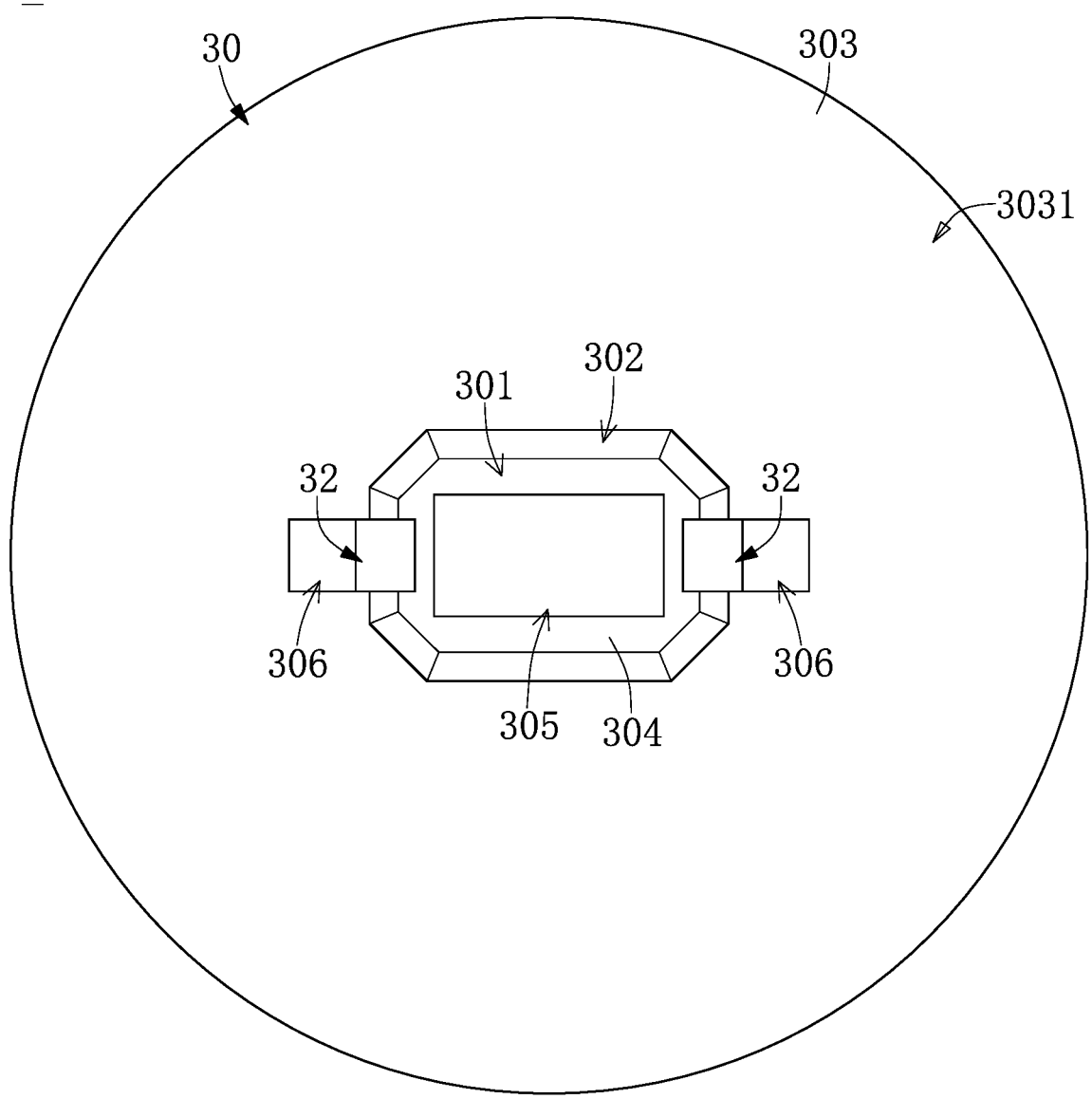
FIG. 9 is a top view of the carrier device according to the first embodiment of the present disclosure.
Figure 10:
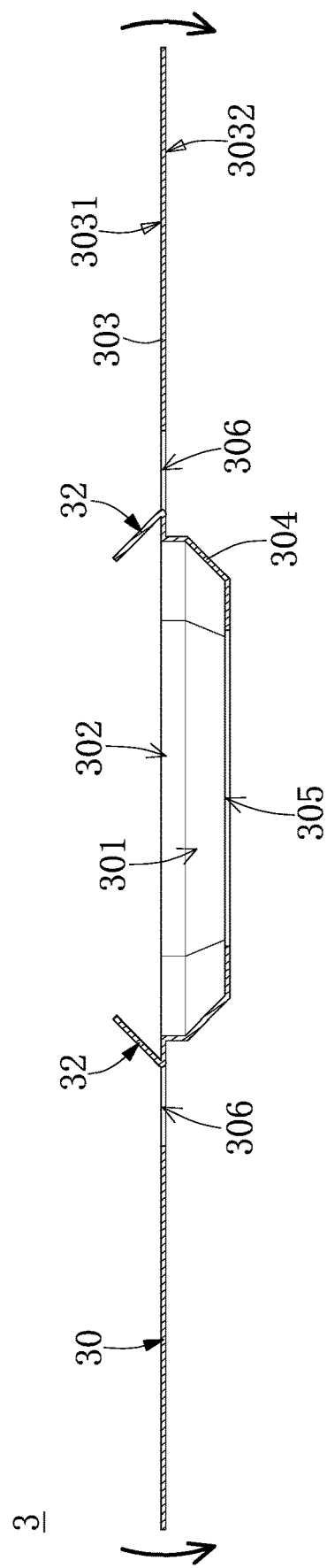
FIG. 10 is a sectional view of the carrier device according to the first embodiment of the present disclosure.

Referring to FIG. 3 to FIG. 10, FIG. 5 is an assembled view of the carrier device carrying the specimen carrier according to the first embodiment of the present disclosure, and FIG. 6 is an exploded view of the carrier device carrying the specimen carrier according to the first embodiment of the present disclosure. FIG. 7 is a perspective view of the specimen carrier of the carrier kit of the present disclosure, and FIG. 8 is a sectional view of the specimen carrier of the carrier kit of the present disclosure. FIG. 9 is a top view of the carrier device according to the first embodiment of the present disclosure, and FIG. 10 is a sectional view of the carrier device according to the first embodiment of the present disclosure. The carrier device 3 of the present disclosure is disposed in the recess 1131 of the carrying end 113 of the specimen holder 11 and is configured to carry the specimen carrier 2.

The specimen carrier 2 is configured to carry a specimen to be observed. The specimen carrier 2 has two observation grooves 20 respectively recessed on two opposite sides thereof and a containing channel 21 that is formed therein and is configured to receive the specimen to be observed. Each of the two observation grooves 20 is configured to expose a part of the containing channel 21. In practice, the specimen carrier 2 can be made of silicon and can have a Si3N4 film disposed therein to separate the containing channel 21.

In the present embodiment, the carrier device 3 includes a main body 30 and two limiting elements 32, but it is not limited thereto. In other embodiments, the carrier device 3 can also include only one of the limiting elements 32, or the carrier device 3 can include more than three of the limiting elements 32.

The main body 30 has a containing groove 301 recessed on a side thereof, and a containing opening 302 formed at a side of the main body 30 and corresponding to the containing groove 301 in position. At least a part of the specimen carrier 2 can be disposed in the containing groove 301 through the containing opening 302. The containing groove 301 is mainly configured to receive the specimen carrier 2, accordingly, the size and the shape of the containing groove 301 can roughly correspond to the size and the shape of the specimen carrier 2, but the specific size and the specific shape of the containing groove 301 are not limited to FIGs of the present disclosure.

As long as the containing groove 301 can at least contain half of the specimen carrier 2, the containing groove 301 can be in any shape. The entire main body 30 can be in a disc-shape. Exemplarily, the main body 30 and the standard copper grid can have the same size, for example, the main body 30 can be a disc-shaped copper sheet structure with a diameter of 3 mm.

Specifically speaking, the main body 30 includes a sheet structure 303 and a support structure 304, the sheet structure 303 is in a disc-shape and has two opposite sides respectively defined as a top surface 3031 and a bottom surface 3032. The sheet structure 303 has the containing opening 302 and the support structure 304 is formed by extending outward from the bottom surface 3032 of the sheet structure 303. The sheet structure 303 and the support structure 304 jointly form the containing groove 301, and an observation port 305 of the main body 30 is formed on a side of the support structure 304 that is away from the sheet structure 303.

In practice, the support structure 304 and the main body 30 can be integral, but it is not limited thereto. In a different application, the support structure 304 can be fixed on the main body 30 by any kind of processing manner. More specifically, the shape of the support structure 304 and the shape of the containing groove 301 can be adjusted according to the size and the shape of the specimen carrier 2, the shape of the support structure 304 and the shape of the containing groove 301 shown in FIGs of the present embodiment are only one of the configurations.

As shown in FIG. 5 and FIG. 6, in practice, the containing groove 301 has a depth less than a height of the specimen carrier 2, and when the specimen carrier 2 is disposed in the containing groove 301, a part of the specimen carrier 2 can be correspondingly exposed from the main body 30, but it is not limited thereto, in other embodiments, the depth of the containing groove 301 can be greater than the height of the specimen carrier 2.

As shown in FIG. 5, FIG. 6, FIG. 9, and FIG. 10, the two limiting elements 32 are disposed on the main body 30 and are configured to fix the specimen carrier 2 disposed in the containing groove 301 with the main body 30. The two limiting elements 32 are mainly configured to limit a range of movement of the specimen carrier 2 relative to the main body.

Figure 15:
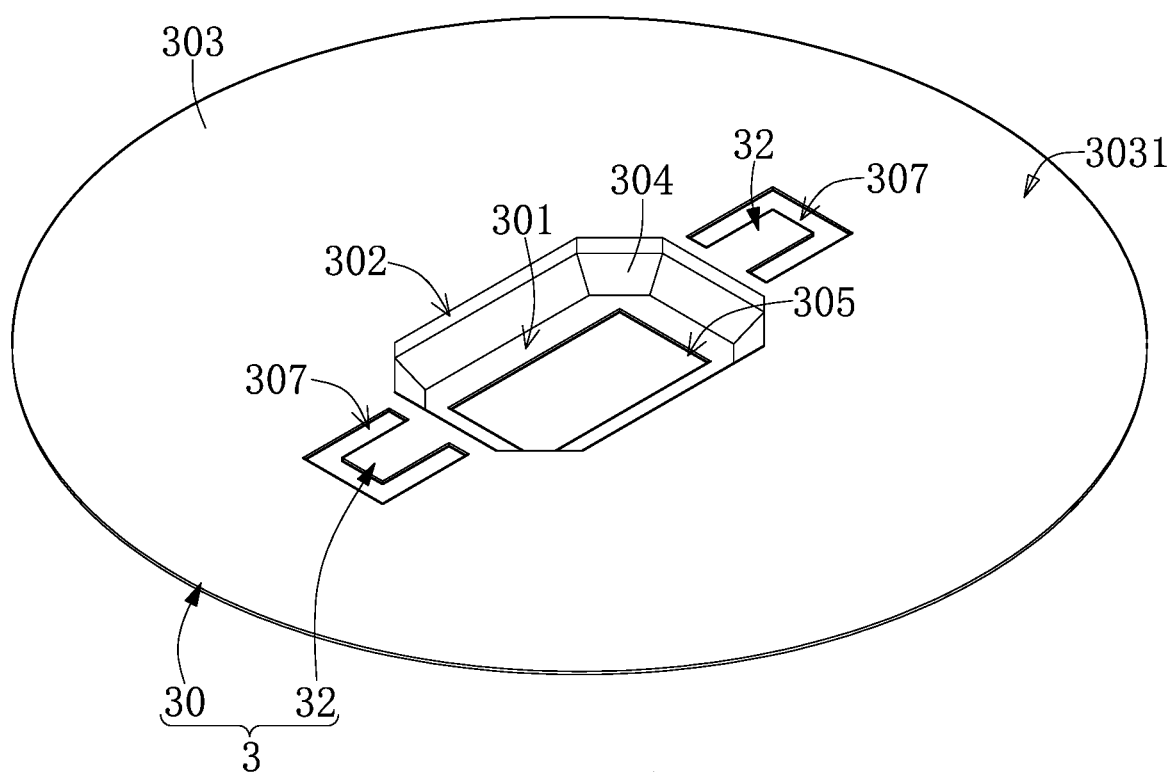
FIG. 15 is a schematic view of the carrier device according to the second embodiment of the present disclosure.

As shown in FIG. 6 and FIG. 9, each of the two limiting elements 32 can be integrally formed with the main body 30, more specifically, when the carrier device 3 is manufactured, the two containing grooves 301 can respectively have two through holes (as shown in FIG. 15) in the C shape that are respectively formed on two sides of the containing groove 301, and then the structure located in the middle of the two through holes in the C shape is bent upward to form the aforementioned two limiting elements 32 through related machinery or tools. As shown in FIG. 6, the two limiting elements 32 formed in the above manner have one of the two corresponding through holes 306 formed beside it.

As shown in FIG. 9, in order to allow each of the two limiting elements 32 to effectively cooperate with the main body 30 to jointly fix the specimen carrier 2 disposed in the containing groove 301. In the top view of the carrier device 3, each of the two limiting elements 32 has a part correspondingly located in the containing opening 302. Accordingly, as shown in FIG. 5, when the specimen carrier 2 is disposed in the containing groove 301, each of the two limiting elements 32 abut against a side of the specimen carrier 2.

Figure 11:
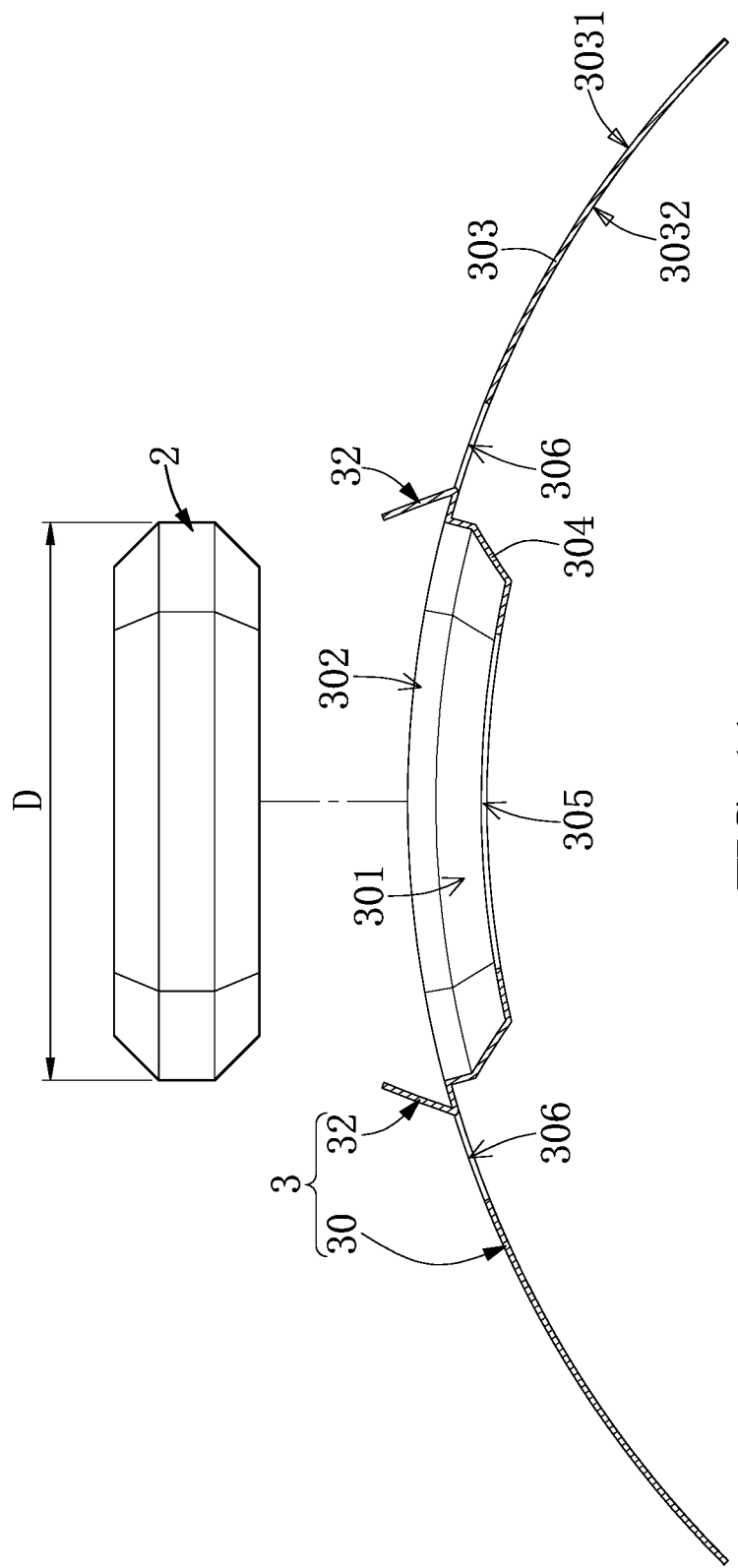
FIG. 11 to FIG. 13 are schematic views showing a process of the specimen carrier (non-sectional) being disposed in the carrier device (sectional) according to the first embodiment of the present disclosure.

Referring to FIG. 10 to FIG. 13, FIG. 11 to FIG. 13 are schematic views showing the process of the specimen carrier (non-sectional) being disposed in the carrier device (sectional) according to the first embodiment of the present disclosure. As shown in FIG. 10, in practice, when the carrier device 3 of the present embodiment is manufactured, the two limiting elements 32 are integrally formed with the main body 30 and the two limiting elements 32 are disposed to face each other. The two limiting elements 32 have a distance between each other that is less than a length D of the specimen carrier 2 (as shown in FIG. 11).

When the related personnel purchases the carrier device 3 and prepares to dispose the specimen carrier 2 in the containing groove 301 of the carrier device 3, the related personnel can operate the carrier device 3 according to the operation process as shown in FIG. 10 to FIG. 13. More specifically, first, as shown in FIG. 10, the related personnel can fix the two sides of the main body 30 having the two limiting elements 32 through related auxiliary tools (not shown, for example, the related auxiliary tools can be tweezers, etc.) to allow the main body 30 to be bent in a direction opposite to a direction in which the two limiting elements 32 are formed. Accordingly, the main body 30 changes from the state of FIG. 10 to the state of FIG. 11, and the distance between the two limiting elements 32 will increase.

Figure 12:
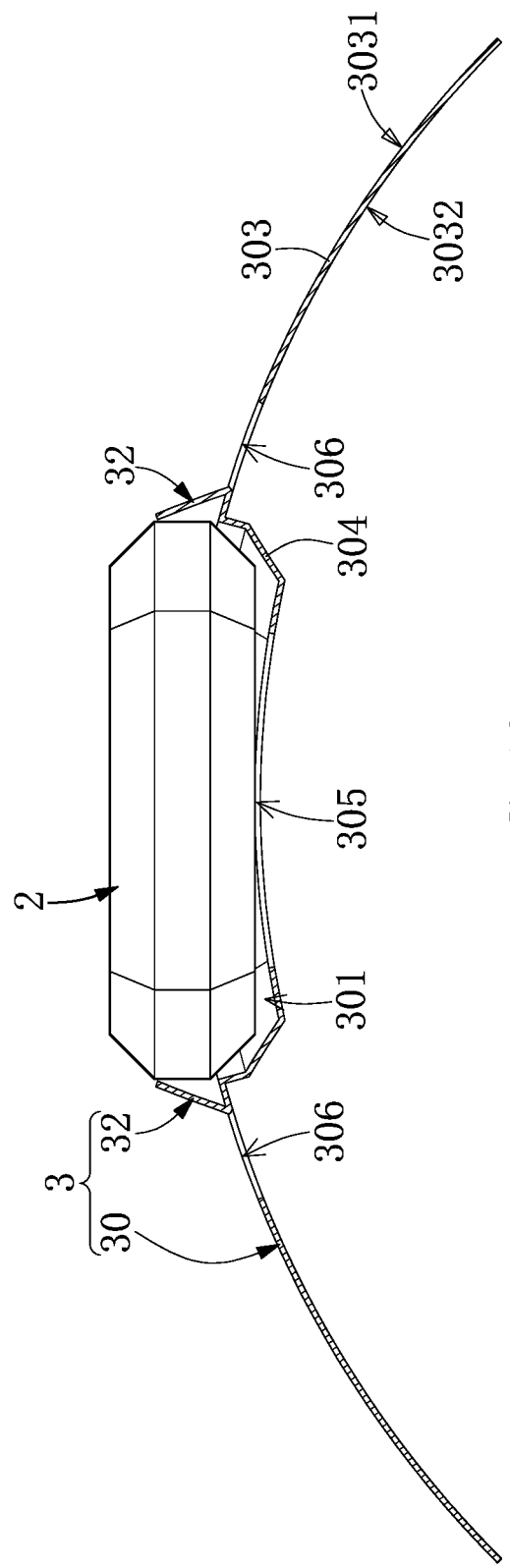
Figure 13:
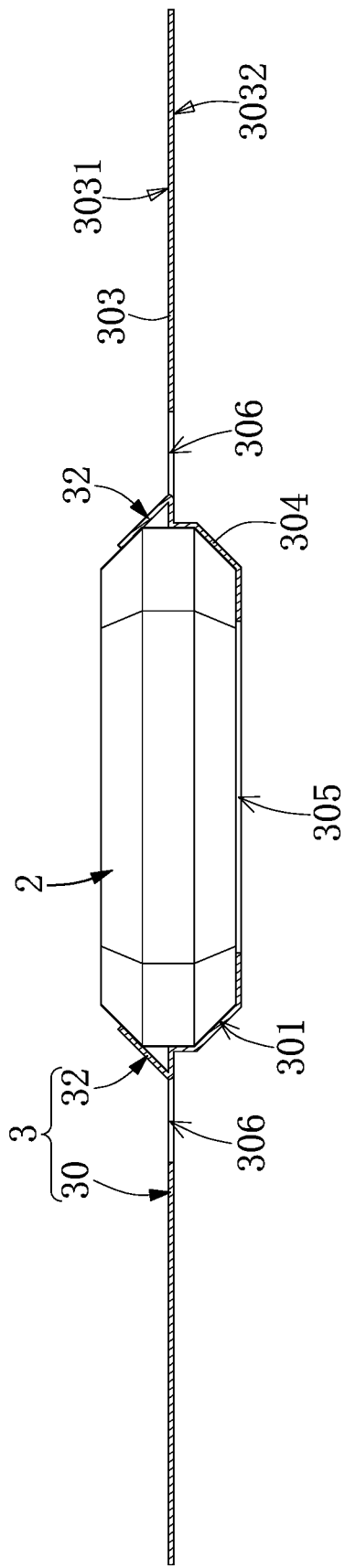

As shown in FIG. 11 and FIG. 12, the related personnel can allow the specimen carrier 2 to be disposed in the containing groove 301 through the two stretched open limiting elements 32. As shown in FIG. 12 and FIG. 13, after the specimen carrier 2 is disposed in the containing groove 301, the related auxiliary tools can no longer bend the main body 30, and then the main body 30 transforms from the state shown in FIG. 12 to the state shown in FIG. 13 through its own elastic restoring force. Accordingly, the two limiting elements 32 abut against two sides of the specimen carrier 2, and the two limiting elements 32 generate the elastic restoring force due to the resistance of the specimen carrier 2 so as to tightly abut against the specimen carrier 2.

As mentioned above, as shown in FIG. 1 to FIG. 4, and FIG. 13, when the carrier device 3 carrying the specimen carrier 2 is disposed in the recess 1131, and the restricting element 114 abuts against the main body 30, the electron beam emitter 101 emits the electron beam that can pass through the observation groove 20 of the specimen carrier 2, the specimen in the containing channel 21, the observation port 305 of the carrier device 3, and the through hole 1132 of the carrier end 113. Accordingly, the specimen in the containing channel 21 can be observed through the observation device 102, and the processing device 103 can control the display device 105 to display an image corresponding to the specimen.

It should be noted that the conventional manner uses glue to fix the element capable of carrying the liquid specimen to the copper ring. Since the size of the element carrying the liquid specimen is small, when the element capable of carrying the liquid specimen is fixed to the copper ring through the use of glue by the related personnel, it is easy for the glue to flow into and stick to an observation window capable of carrying the liquid specimen. This may cause the problem that the electron beam cannot pass through the liquid specimen smoothly and the liquid specimen cannot be observed by the related personnel.

In contrast, the carrier device 3 of the present disclosure and the specimen carrier 2 can be fixed to each other through the limiting element 32 without using any glue. Accordingly, the probability of unexpected external interference of the liquid specimen carried by the specimen carrier 2 can be greatly reduced.

Figure 14:
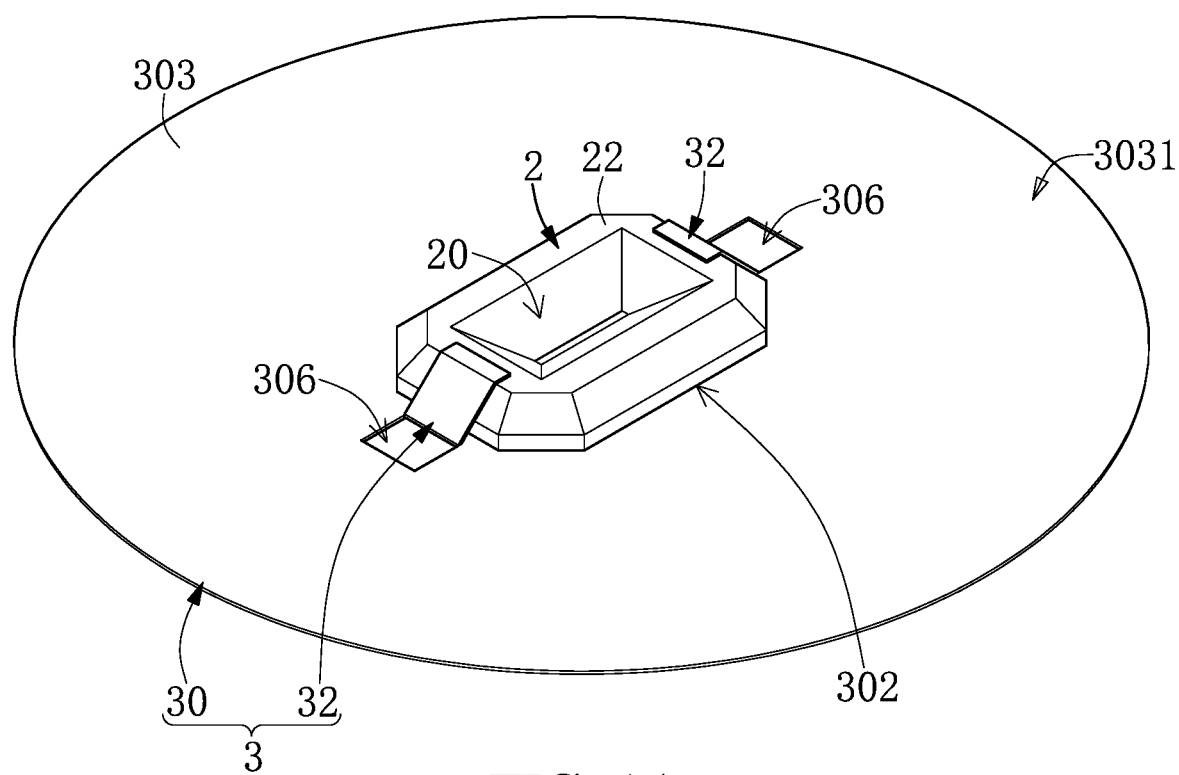
FIG. 14 is a schematic view of a specimen carrier being disposed in a carrier device according to a second embodiment of the present disclosure.

Referring to FIG. 14 and FIG. 15, FIG. 14 is a schematic view of a specimen carrier disposed in a carrier device according to a second embodiment of the present disclosure, and FIG. 15 is a schematic view of the carrier device according to the second embodiment of the present disclosure. The main difference between the second embodiment and the first embodiment is that when the specimen carrier 2 is disposed in the carrier device 3, each of the two limiting elements 32 has a part that can relatively abut against a top surface 22 of the specimen carrier 2.

As shown in FIG. 14 and FIG. 15, it is worth mentioning that the carrier device 3 can be sold in the form shown in FIG. 15 in practice. After the carrier device 3 as shown in FIG. 15 is purchased by the related personnel, the specimen carrier 2 can be disposed in the containing groove 301 first, and then the related personnel can use the related tools (such as tweezers) to bend a structure that is in a C-shape and is located in the through hole 307 toward the specimen carrier 2 to form the two of the limiting elements 32 mentioned above accordingly.

Figure 16:
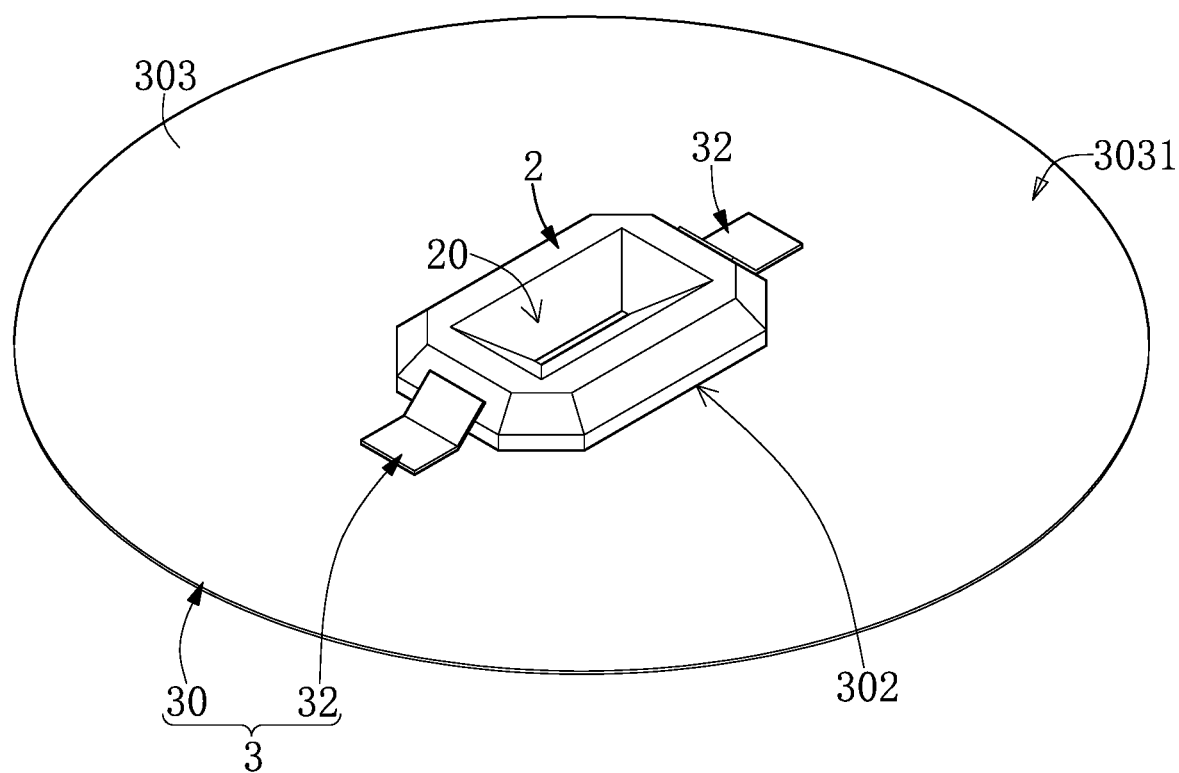
FIG. 16 is a schematic view of a specimen carrier being disposed in a carrier device according to a third embodiment of the present disclosure.

Reference is made to FIG. 16, which is a schematic view of a specimen carrier disposed in a carrier device according to a third embodiment of the present disclosure. The main difference between the third embodiment and the previous embodiments is that each of the two limiting elements 32 is not integrally formed with the main body 30, and each of the two limiting elements 32 is additionally fixed on the main body 30.

In practice, each of the two limiting elements 32 can be pre-fixed on the main body 30 when the carrier device 3 of the present disclosure is manufactured. Each of the two limiting elements 32 can also be not assembled on the main body 30 first, and after the carrier device 3 is purchased by the related personnel, the two limiting elements 32 can be fixed on the main body 30, and then the related personnel disposes the specimen carrier 2 in the containing groove 301 according to the assembling manner as shown in FIG. 10 to FIG. 13.

Figure 17:
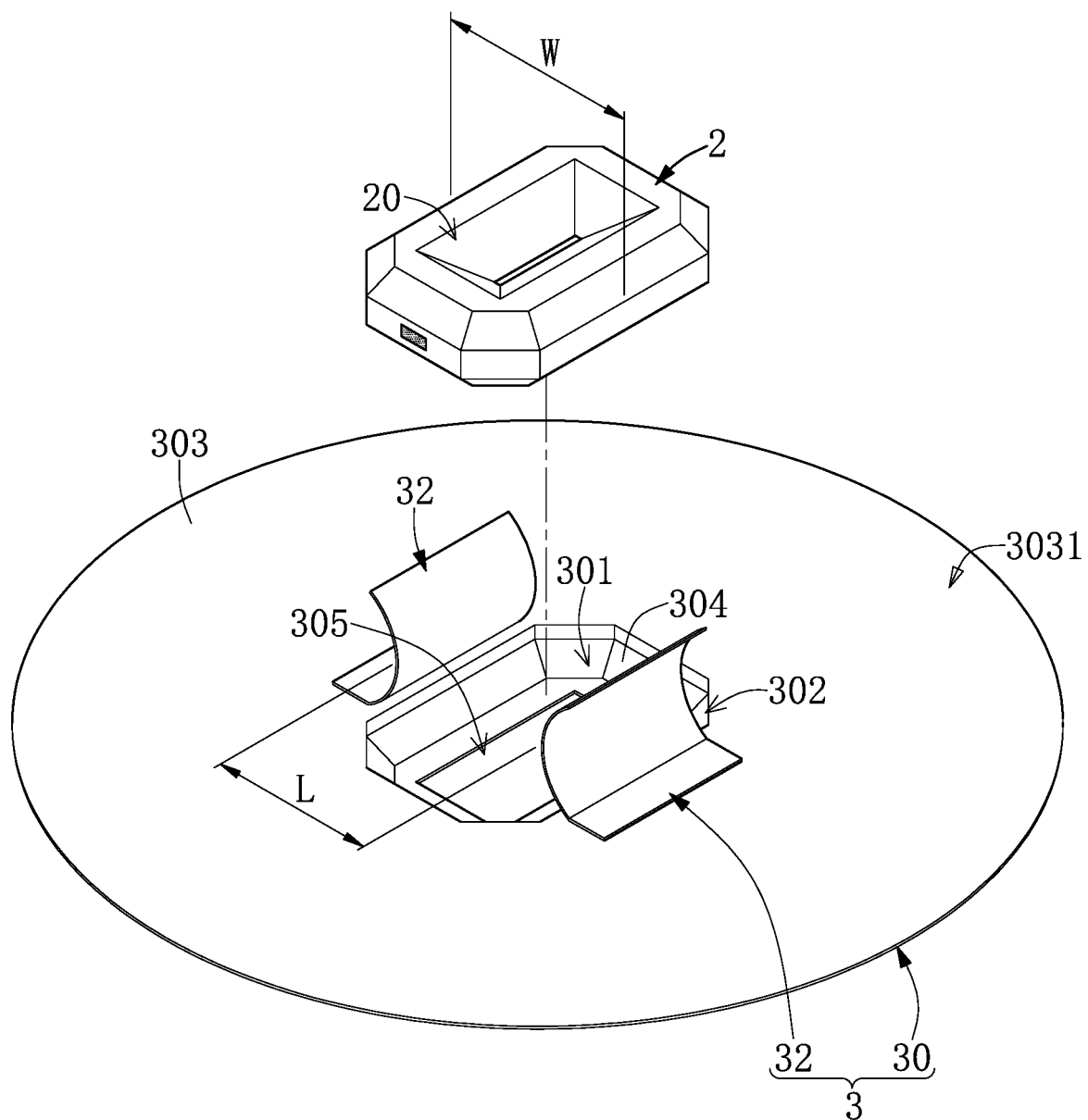
FIG. 17 is an exploded view of a specimen carrier and a carrier device according to a fourth embodiment of the present disclosure.

Reference is made to FIG. 17, which is an exploded view of a carrier device carrying a specimen carrier according to a fourth embodiment of the present disclosure. The main difference between the fourth embodiment and the previous embodiments is that the two limiting elements 32 can be disposed adjacent to two long sides of the containing groove 301, and the two limiting elements 32 have the shortest distance L between each other that is less than a width W of the specimen carrier 2.

When the specimen carrier 2 is disposed in the containing groove 301 through the two limiting elements 32, the two limiting elements 32 are squeezed through the specimen carrier 2 so that the two limiting elements are elastically deformed. When half of the specimen carrier 2 is disposed in the containing groove 301, the two limiting elements 32 squeezed to be elastically deformed will tightly and respectively abut against two long sides of the specimen carrier 2.

Each of the two limiting elements 32 are not integrally formed with the main body 30 in FIG. 17 of the present embodiment, but it is not limited thereto. In other embodiments, each of the two limiting elements 32 can also be integrally formed with the main body 30. Furthermore, as long as the two limiting elements 32 can be elastically deformed when the specimen carrier 2 passes through, and as long as half of the specimen carrier 2 is disposed in the containing groove 301, the elastically deformed two limiting elements 32 can tightly abut against the specimen carrier 2. The two limiting elements 32 can be in any type of shape, and each of the two limiting elements 32 is not limited to the arc structure shown in FIG. 17 of the present embodiment.

It should be noted that the two limiting elements 32 are disposed adjacent to the two long sides of the containing groove 301, but it is not limited thereto. In other embodiments, the two limiting elements 32 can also be disposed adjacent to two short sides of the containing groove 301. Similarly, in previous embodiments, the two limiting elements 32 are disposed adjacent to the two short sides of the containing groove 301, but the two limiting elements 32 can also be disposed adjacent to the two long sides of the containing groove 301.

It is worth mentioning that a quantity of the at least one limiting element 32 of the carrier device 3 is two, and the two limiting elements 32 are disposed to face each other in the previous embodiments, but the quantity of the at least one limiting element 32 of the carrier device 3 is not limited to being two. In other embodiments, the quantity of the at least one limiting element 32 of the carrier device 3 can also be four, and the four limiting elements 32 are relatively disposed on four sides adjacent to the containing groove 301. In some special applications, the two limiting elements 32 of the carrier device 3 can be disposed at opposite corners of the containing groove 301, but are not limited to be disposed on the two sides of the containing groove 301.

Referring to FIG. 18 and FIG. 19, FIG. 18 is an exploded view of a carrier device 3 (sectional) carrying a specimen carrier 2 (non-sectional) according to a fifth embodiment of the present disclosure, and FIG. 19 is an assembled view of the carrier device 3 (sectional) carrying the specimen carrier 2 (non-sectional) according to the fifth embodiment of the present disclosure.

The main difference between the fifth embodiment and the previous embodiments is that the carrier device 3 can only include one of the limiting elements 32. The limiting element 32 includes a fixed base 321 fixed on the main body 30 and a flexible structure 322 that is configured to be operated to bend in a direction that is close to or away from the containing groove 301.

As shown in FIG. 18, when the specimen carrier 2 is disposed in the containing groove 301 by the related personnel, the flexible structure 322 can be bent in a direction that is away from the containing groove 301, so that the specimen carrier 2 can be directly disposed in the containing groove 301 without being blocked.

As shown in FIG. 19, when the specimen carrier 2 is disposed in the containing groove 301 by the related personnel, the flexible structure 322 can be bent again, so that the flexible structure 322 abuts against the specimen carrier 2 to limit the range of movement of the specimen carrier 2 disposed in the containing groove 301 relative to the main body 30. It should be noted that the quantity of the at least one limiting element 32 of the carrier device 3 mentioned in the fifth embodiment can be more than two in other embodiments.

Figure 20:
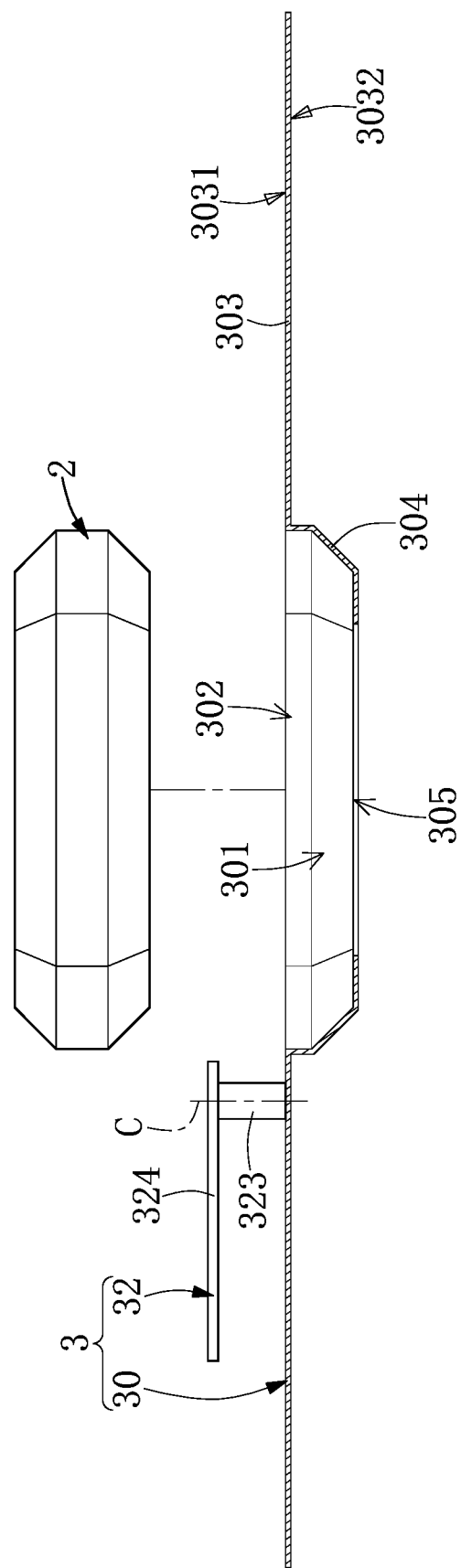
FIG. 20 and FIG. 21 are schematic views showing a process of a specimen carrier (non-sectional) being disposed in a carrier device (sectional) according to a sixth embodiment of the present disclosure.
Figure 21:
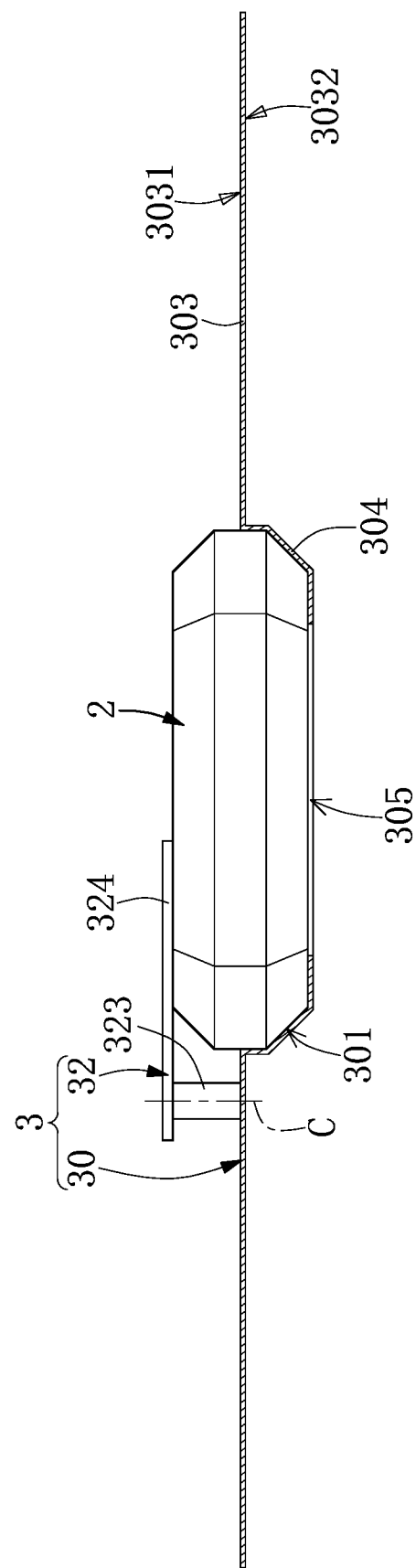

Referring to FIG. 20 and FIG. 21, FIG. 20 is an exploded view of a carrier device 3 (sectional) carrying a specimen carrier 2 (non-sectional) according to a sixth embodiment of the present disclosure, and FIG. 21 is an assembled view of the carrier device 3 (sectional) carrying the specimen carrier 2 (non-sectional) according to the sixth embodiment of the present disclosure.

The main difference between the sixth embodiment and the previous embodiments is that the at least one limiting element 32 of the carrier device 3 includes a pivoting portion 323 rotatably connected to the main body 30 and an abutting portion 324 that is connected to the pivoting portion 323. The abutting portion 324 and the pivoting portion 323 can rotate relative to the main body 30 together. The pivoting portion 323 is centered on a central axis C parallel to a normal direction of the main body 30 and rotates relative to the main body 30.

As shown in FIG. 20, when the specimen carrier 2 is disposed in the containing groove 301 by the related personnel, the abutting portion 324 is configured to rotate relative to the main body 30 through the abutting portion 324, so that the abutting portion 324 is not located above the containing groove 301. Accordingly, half of the specimen carrier 2 can be disposed in the containing groove 301 by the related personnel. As shown in FIG. 21, when half of the specimen carrier 2 is disposed in the containing groove 301, the abutting portion 324 can abut against an upper portion of the containing groove 301 by operating the abutting portion 324 to limit the range of movement of the specimen carrier 2 relative to the main body 30.

Figure 22:
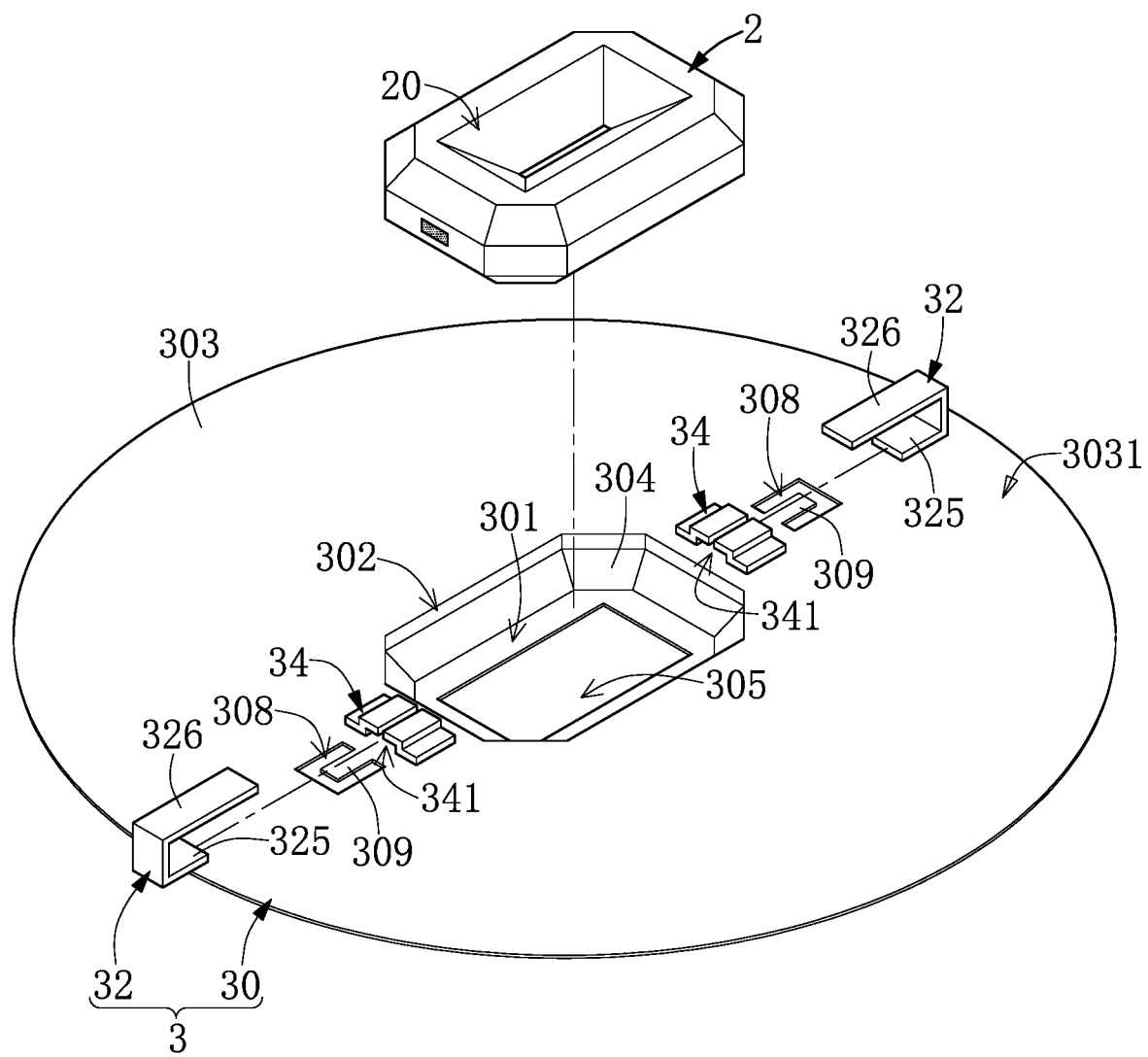
FIG. 22 is an exploded view of a carrier device carrying a specimen carrier according to a seventh embodiment of the present disclosure.
Figure 23:
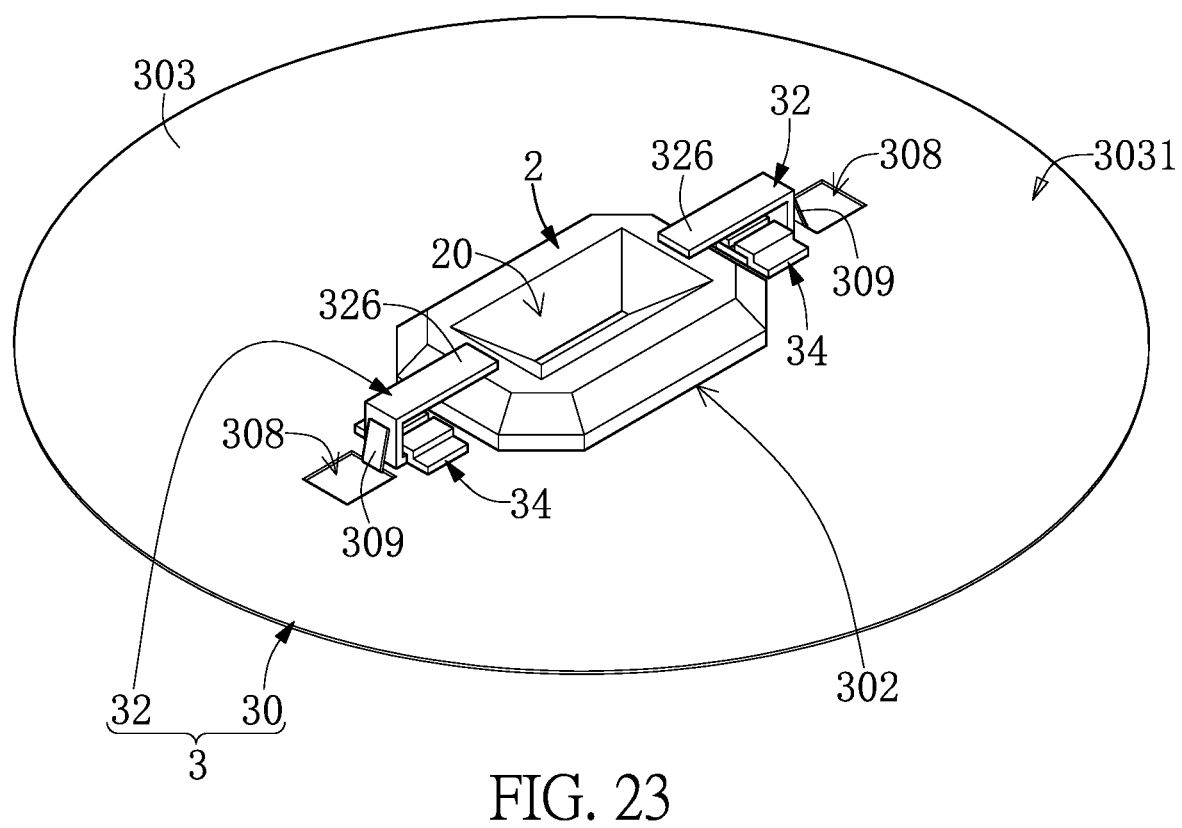
FIG. 23 is an assembled view of the carrier device carrying the specimen carrier according to the seventh embodiment of the present disclosure.

Referring to FIG. 22 and FIG. 23, FIG. 22 is an exploded view of a carrier device carrying a specimen carrier according to a seventh embodiment of the present disclosure, and FIG. 23 is an assembled view of the carrier device carrying the specimen carrier according to the seventh embodiment of the present disclosure. The main difference between the seventh embodiment and the previous embodiments is that the two limiting elements 32 of the carrier device 3 can slide toward or away from the containing groove 301 relative to the main body 30, so as to selectively limit the specimen carrier 2 in the containing groove 301. Specifically speaking, the carrier device 3 can include two of the limiting elements 32 and two track structures 34, and each of the two limiting elements 32 includes a sliding portion 325 and an abutting portion 326. The sliding portion 325 is configured to move on the top surface 3031 of the main body 30 in a direction that is close to or away from the containing groove 301, and the abutting portion 326 is connected to the sliding portion 325, so that the abutting portion 326 and the sliding portion 325 are configured to move relative to the main body 30 together.

The two track structures 34 are disposed on the main body 30 and are adjacent to two ends of the containing groove 301. Each of the two track structures 34 has a track channel 341 that can be movably disposed on each of the two track structures 34. Each of the two track structures 34 can be additionally fixed on the main body 30 by the use of glue or various processing manners, but it is not limited thereto. In other embodiments, each of the two track structures 34 can be integrally formed with the main body 30. The shape of each of the two track structures 34 can be adjusted according to requirements, and the shape of the track channel 341 and the shape of the sliding portion 325 can also be adjusted according to requirements.

In practice, the specimen carrier 2 can be disposed in the containing groove 301 by the related personnel, and the sliding portion 325 of each of the two limiting elements 32 is inserted in each of the two track channels 341 corresponding to the sliding portion 325. Accordingly, the abutting portion 326 of each of the two limiting elements 32 abuts against an end of the specimen carrier 2 corresponding to each of the two abutting portions 326, so that each of the two limiting elements 32 can limit the range of movement of the specimen carrier 2 relative to the main body 30.

In the present embodiment, when the carrier device 3 is packaged for sale, each of the two limiting elements 32 can be not combined with the two track structures 34. The specimen carrier 2 can be disposed in the containing groove 301 after the related personnel gets the carrier device 3, and then each of the two limiting elements 32 is connected to each of the two track structures 34. Furthermore, in practice, each of the two track structures 341 has a size slightly smaller than the size of each of two sliding portions 325, and each of two moving portions 1141 and each of the two track structures 341 can be fixed to each other in a tight fit. In other embodiments, a structure for limiting the movement of the two limiting elements 32 relative to the two track structures 34 can also be arranged at the position of the main body 30 adjacent to each of the two track structures 34.

For example, the main body 30 can form a through hole 308 in a C-shape on two sides thereof adjacent to the two track structures 34. When the moving portion 1141 of the two limiting elements 32 is disposed in the two track structures 341 by the related personnel, the structure surrounded by the through hole 308 in the C-shape is bent upwards through the related tools. Accordingly, a stop structure 309 is formed and is configured to limit the two limiting elements 32 from departing from the two track structures 34.

It should be noted that the two limiting elements 32 and the two track structures 34 shown in FIG. 22 and FIG. 23 of the present embodiment is only one of the embodiments in which the limiting element 32 is slidably fixed to the main body 30. In practice, any limiting element 32 that can slide relative to the main body 30 to limit the variation of the specimen carrier 2 in the containing groove 301 belong to the changes covered by this embodiment. Furthermore, the quantity of the limiting elements 32 and the quantity of the track structures 34 of the carrier device 3 is not limited to FIG. 22 and FIG. 23 of the present embodiment.

Figure 24:
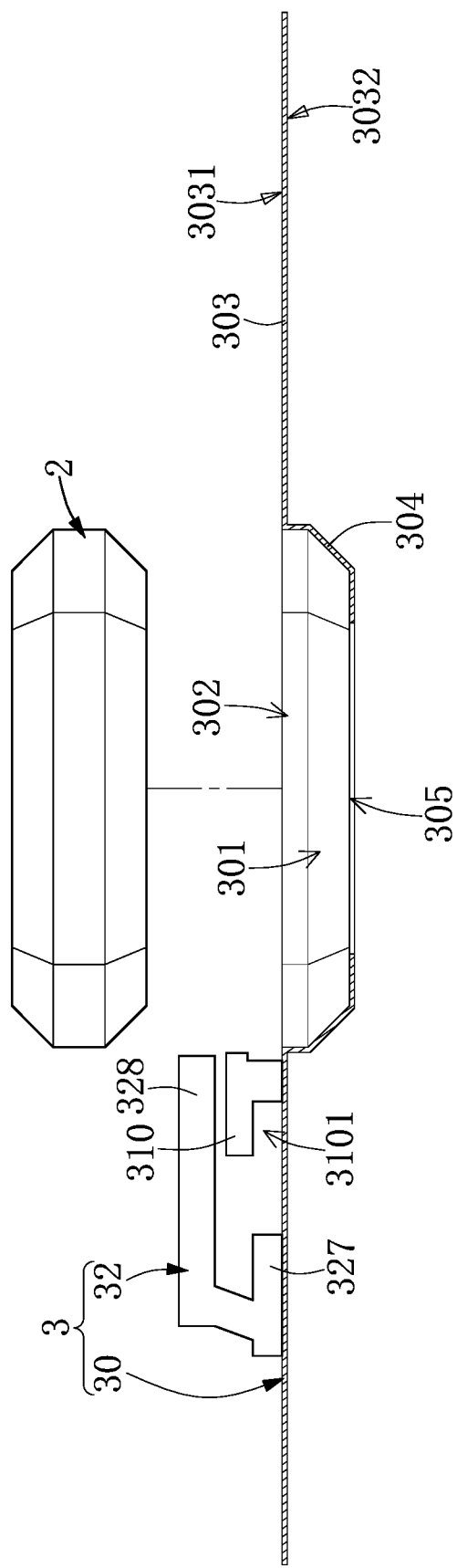
FIG. 24 and FIG. 25 are schematic views showing a process of a specimen carrier (non-sectional) being disposed in a carrier device (sectional) according to an eighth embodiment of the present disclosure.
Figure 25:
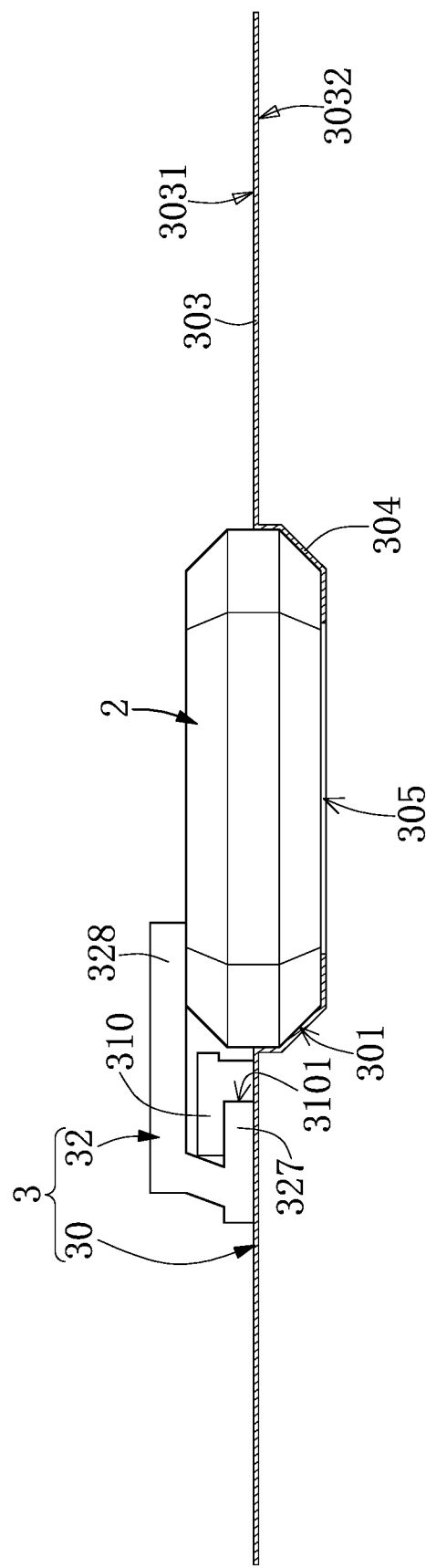

Referring to FIG. 24 and FIG. 25, FIG. 24 is an exploded view of a carrier device (sectional) carrying a specimen carrier (non-sectional) according to an eighth embodiment of the present disclosure, and FIG. 25 is an assembled view of the specimen carrier (non-sectional) disposed in the carrier device (sectional) according to the eighth embodiment of the present disclosure. The main difference between the eighth embodiment and the previous embodiments is that the main body 30 can include a first engagement structure 310 that includes an engagement groove 3101. The at least one limiting element can also include a second engagement structure 327 and an abutting portion 328.

The second engagement structure 327 of the at least one limiting element 32 is configured to engage with the engagement groove 3101, and the abutting portion 328 and the second engagement structure 327 can be connected to each other. When the second engagement structure 327 is engaged within the engagement groove 3101, the abutting portion 328 can abut against an end of the specimen carrier 2 disposed in the containing groove 301 to limit the range of movement of the specimen carrier 2 relative to the main body 30.

In practice, the size of the engagement groove 3101 can be slightly smaller than the size of the second engagement structure 327, and when the second engagement structure 327 is engaged within the engagement groove 3101, the second engagement structure 327 and the engagement groove 3101 can be fixed to each other in a tight fit manner. In practice, the carrier device 3 can include a single one of the first engagement structure 310 that cooperates with a single one of the limiting elements 32. The carrier device 3 can also include more than two of the first engagement structures 310 that cooperate with more than two of the limiting elements 32.

Figure 26:
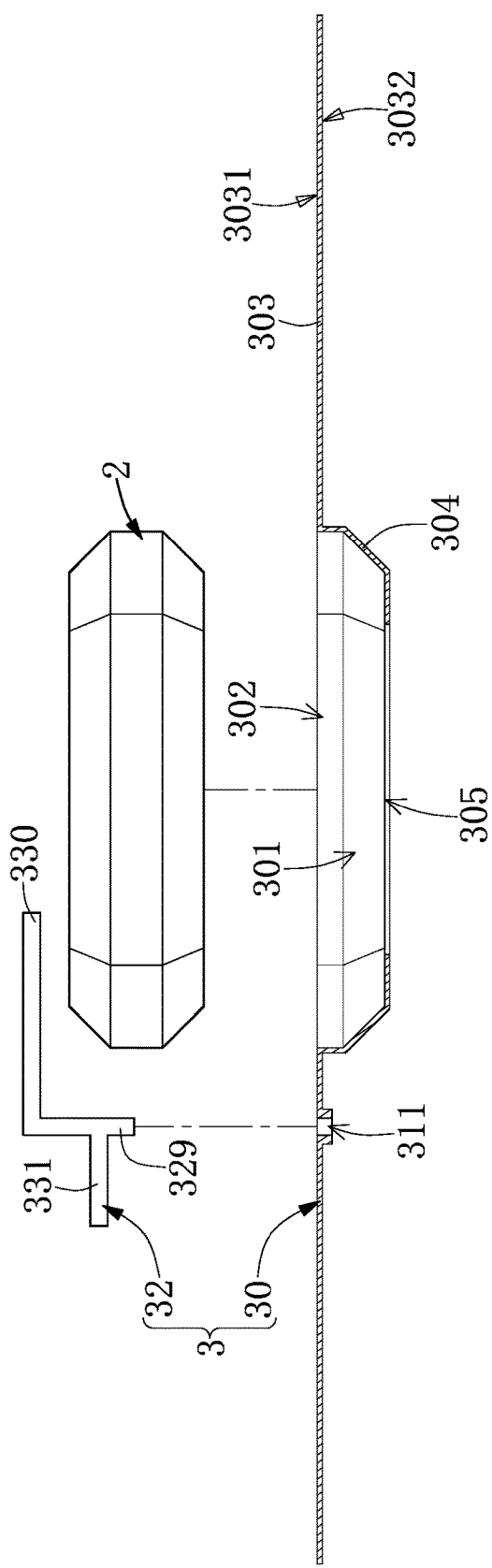
FIG. 26 and FIG. 27 are schematic views showing a process of a specimen carrier (non-sectional) being disposed in a carrier device (sectional) according to a ninth embodiment of the present disclosure.
Figure 27:
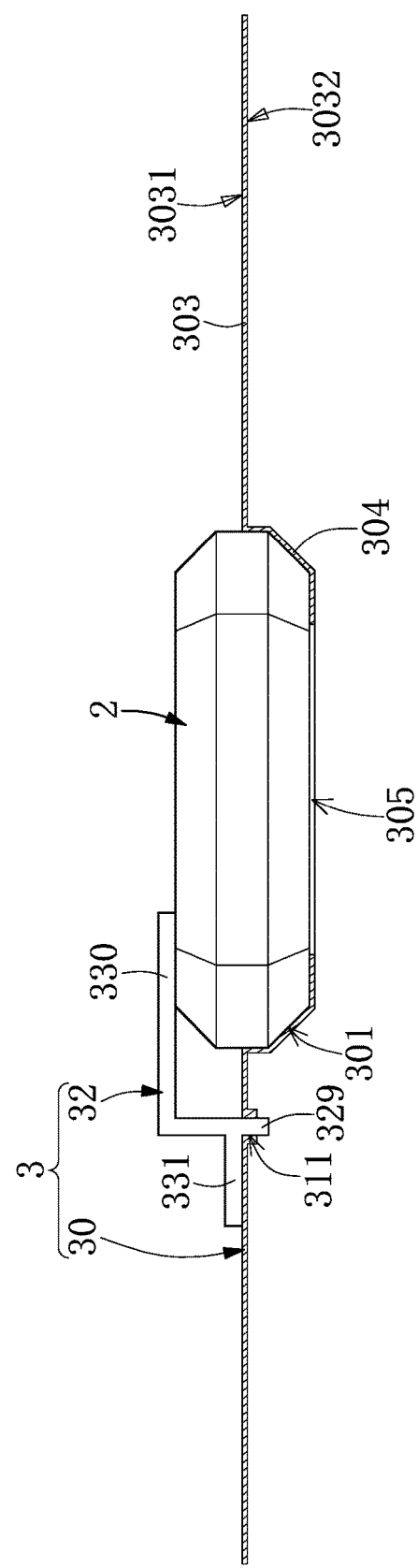

Referring to FIG. 26 and FIG. 27, FIG. 26 is an exploded view of a carrier device (sectional) carrying a specimen carrier (non-sectional) according to a ninth embodiment of the present disclosure, and FIG. 27 is an assembled view of the specimen carrier (non-sectional) disposed in the carrier device (sectional) according to the ninth embodiment of the present disclosure.

The main difference between the ninth embodiment and the previous embodiments is that the main body 30 of the carrier device 3 includes a fixed hole 311, and the at least one limiting element 32 includes an insertion portion 329 inserting into the fixed hole 311 and an abutting portion 330 that is connected to the insertion portion 329. When the insertion portion 329 inserts into the fixed hole 311, the abutting portion 330 can abut against the specimen carrier 2 disposed in the containing groove 301 relatively so as to limit the range of movement of the specimen carrier 2 relative to the main body 30. In practice, the size of the fixed hole 311 is slightly smaller than the size of the insertion portion 329 of the limiting element 32, and the insertion portion 329 and the fixed hole 311 can be fixed to each other in a tight fit manner.

When the carrier device 3 of the present embodiment is on sale, the at least one limiting element 32 can be unassembled from the main body 30. The specimen carrier 2 can be disposed in the containing groove 301 by the related personnel, and then the insertion portion 329 is inserted into the fixed hole 311, so that the abutting portion 330 abuts against the specimen carrier 2 to limit the range of movement of the specimen carrier 2 relative to the main body 30. The quantity of the at least one limiting element 32 of the carrier device 3 and the quantity of the fixing holes 311 in the present embodiment can be adjusted according to requirements, and is not limited to being one. The shape of the abutting portion 330 of the limiting element 32 can also be adjusted according to the shape of the specimen carrier 2, and the shape of the abutting portion 330 shown in FIG. 26 and FIG. 27 is only one of the exemplary configuration.

It is worth mentioning that the limiting element 32 can further include an abutting portion 331 that is connected to the insertion portion 329. As shown in FIG. 26, when the insertion portion 329 inserts into the fixed hole 311, the abutting portion 331 abuts against the top surface 3031 of the main body 30.

When the carrier device 3 carrying the specimen carrier 2 is disposed on the specimen holder 11 (as shown in FIG. 4), the abutting structure 1142 of the restricting element 114 (as shown in FIG. 4) can abut against the abutting portion 331 of the limiting element 32 relatively, so as to limit the range of movement of the limiting element 32 relative to the main body 30. That is, the abutting portion 331 is configured to abut against the abutting structure 1142 of the specimen holder 11.

Figure 28:
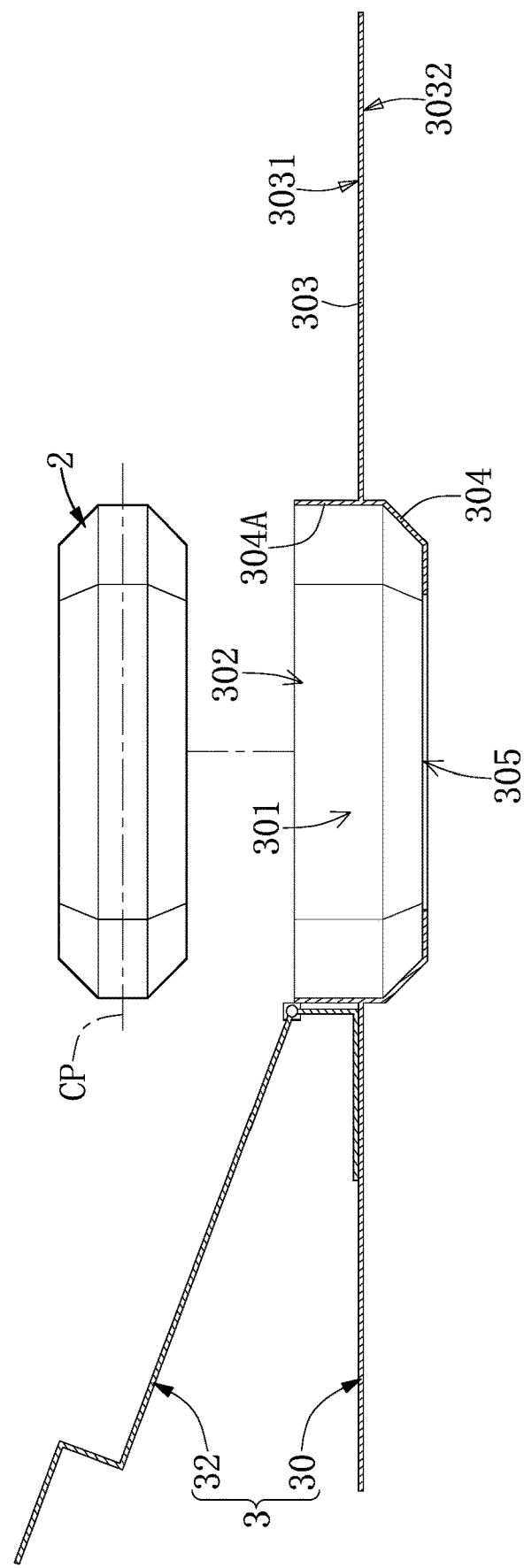
FIG. 28 and FIG. 29 are schematic views showing a process of a specimen carrier (non-sectional) being disposed in a carrier device (sectional) according to a tenth embodiment of the present disclosure.
Figure 29:
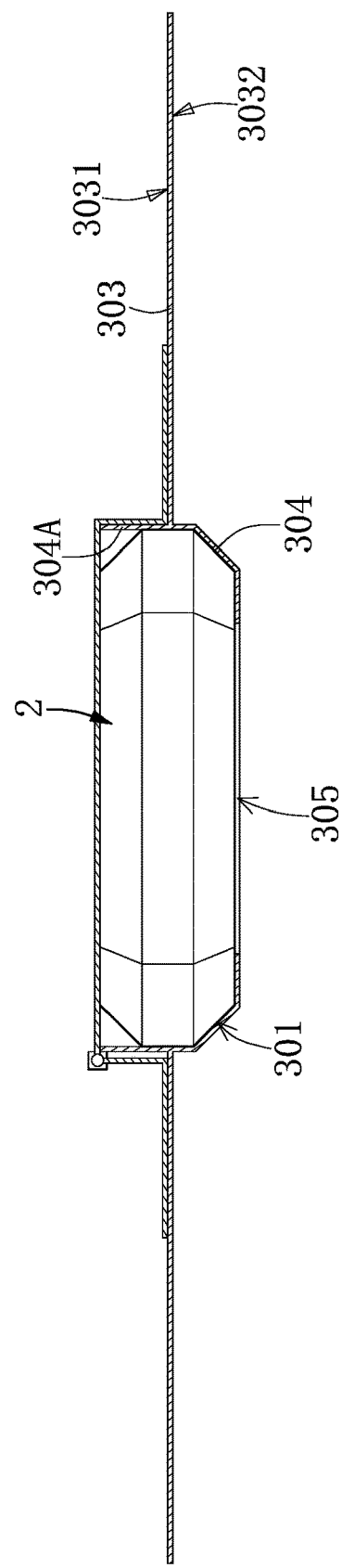

Referring to FIG. 28 and FIG. 29, FIG. 28 is an exploded view of a carrier device (sectional) carrying a specimen carrier (non-sectional) according to a tenth embodiment of the present disclosure, and FIG. 29 is an assembled view of the specimen carrier (non-sectional) disposed in the carrier device (sectional) according to the tenth embodiment of the present disclosure.

The carrier device 3 in the previous embodiments are all examples in which the depth of the containing groove 301 is less than the height of the specimen carrier 2, and when the specimen carrier 2 is disposed in the containing groove 301, half of the specimen carrier 2 is exposed from the main body 30. The carrier device 3 of the present embodiment is an example in which the depth of the containing groove 301 is greater than the height of the specimen carrier 2, and when the specimen carrier 2 is disposed in the containing groove 301, the entire specimen carrier 2 is essentially disposed in the containing groove 301, and the specimen carrier 2 is not exposed from the containing groove 301.

The main difference between the tenth embodiment and the previous embodiments is that the main body 30 has an auxiliary containing structure 304A formed by extending outward from a side of the main body 30 opposite to the side thereof that the support structure 304 is formed, and the auxiliary containing structure 304A, the main body 30, and the support structure 304 jointly form the containing groove 301 that is capable of containing the entire specimen carrier 2. Furthermore, the limiting element 32 is movably disposed on the main body 30 and is configured to be operated to cover a side of the auxiliary containing structure 304A, so that the limiting element 32 limits the range of movement of the specimen carrier 2 disposed in the containing groove 301 relative to the main body 30.

It is worth mentioning that in practice, when the specimen carrier 2 is disposed in the containing groove 301, the central axis CP of the specimen carrier 2 is approximately flush with the top surface 3031 of the main body 30. Accordingly, the problem of image focusing when the specimen carrier 2 is used for specimen observation with the electron microscope equipment can be avoided. In practice, the shape and the height of the auxiliary containing structure 304A relative to the main body 30 can be adjusted according to the shape and the size of the specimen carrier 2, and the shape and the height of the auxiliary containing structure 304A shown in FIG. 28 and FIG. 29 of the present embodiment is only one of the exemplary configuration.

Furthermore, a manner of the limiting element 32 connected to the main body 30 is not limited to the manner thereof shown in FIG. 28 and FIG. 29 of the present embodiment, as long as the limiting element 32 can cooperate with the auxiliary accommodating structure 304A to limit the range of movement of the specimen carrier 2 disposed in the containing groove 301 relative to the main body 30, the size, the shape, and the connection method, etc., of the limiting element 32 and the main body 30 can be adjusted according to requirements.

Figure 30:
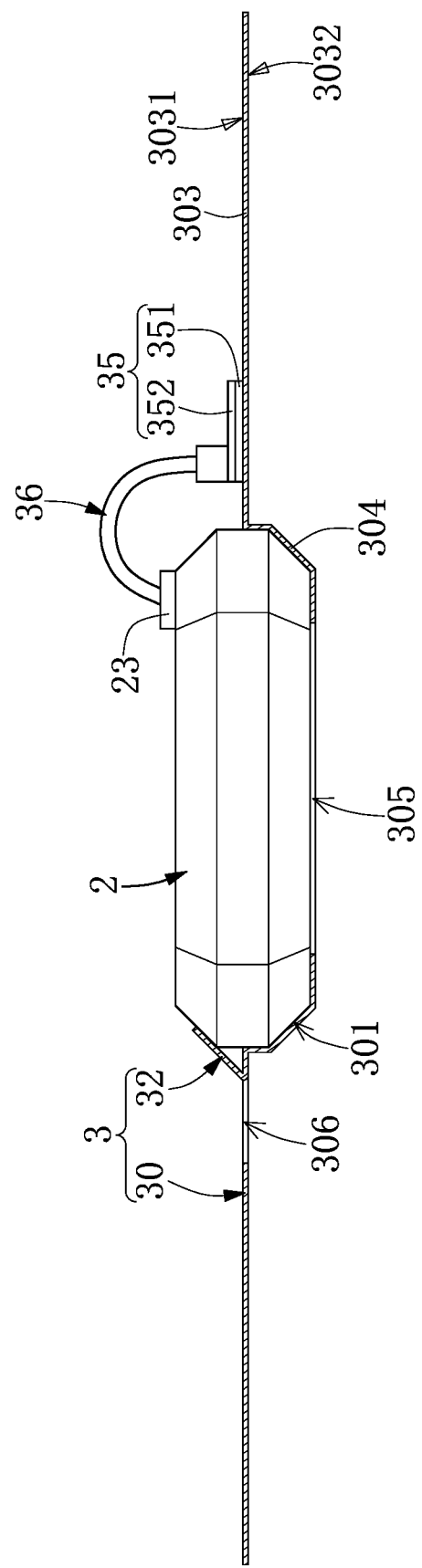
FIG. 30 is a schematic view showing a specimen carrier (non-sectional) being disposed in a carrier device (sectional) according to an eleventh embodiment of the present disclosure.

Reference is made to FIG. 30, which is a schematic view showing a specimen carrier (non-sectional) disposed in a carrier device (sectional) according to an eleventh embodiment of the present disclosure.

The main difference between the eleventh embodiment and the previous embodiments is that the carrier device 3 further includes a processing module 35 fixedly disposed on the main body 30 and an electrical connection element 36 that is connected to the processing module 35, in which the processing module 35 includes a power supply unit 351 configured to store the electricity and a control unit 352 that is electrically connected to the power supply unit 351. The electrical connection element 36 can be a flexible structure capable of conducting electricity.

The electrical connection element 36 has an end being opposite to an end thereof that is connected to the processing module 35, and the specimen carrier 2 has an electrical connection portion 23 and an electronic component, in which the end of the electrical connection element 36 being opposite to the end thereof that is connected to the processing module 35 is configured to be connected to the electrical connection portion 23 of the specimen carrier 2. In practice, the power supply unit 351 is, for example, various types of capacitors, and the control unit 352 is, for example, various types of microprocessors.

When the specimen carrier 2 is disposed in the containing groove 301, and the electrical connection element 36 is connected to the electrical connection portion 23 of the specimen carrier 2, the power supply unit 351 is configured to provide the electricity needed when the control unit 352 is in operation, and the power supply unit 351 is configured to provide the electricity needed when the electronic component inside of the specimen carrier 2 is in operation. The electronic component inside of the specimen carrier 2, for example, includes at least one of a heater, a mixer, a flow controller, a filter, and a switch.

As mentioned above, the carrier device 3 of the present embodiment can supply power to the electronic components of the specimen carrier 2 in the containing groove 301 through the processing module 35 and the electrical connection element 36, so that the specimen in the specimen carrier 2 can be observed at a specific temperature or under a specific condition. It should be noted that the carrier device 3 of the present disclosure and the specimen carrier 2 having the electronic component can be applied on various specimen holders 11 without additionally disposing the power supply unit or the control unit on the specimen holder 11. Accordingly, the observation costs related to the specimen can be greatly reduced.

More specifically, conventional specimen holders 11 do not have the power supply unit or the control unit. If the specimen needs to be heated by the related personnel, expensive specimen rods 11 in specific specifications must be additionally purchased, and thus observation cost greatly increases. In contrast, the carrier device 3 of the present disclosure can cooperate with the specimen carrier 2 having the electronic component, so that the specimen can be directly heated without additionally purchasing the specimen rod 11. It should be noted that the processing module 35 and the electrical connection element 36 of the present embodiment can be applied to any one of the previous embodiments and are not limited to being applied to the present embodiment.

Figure 31:
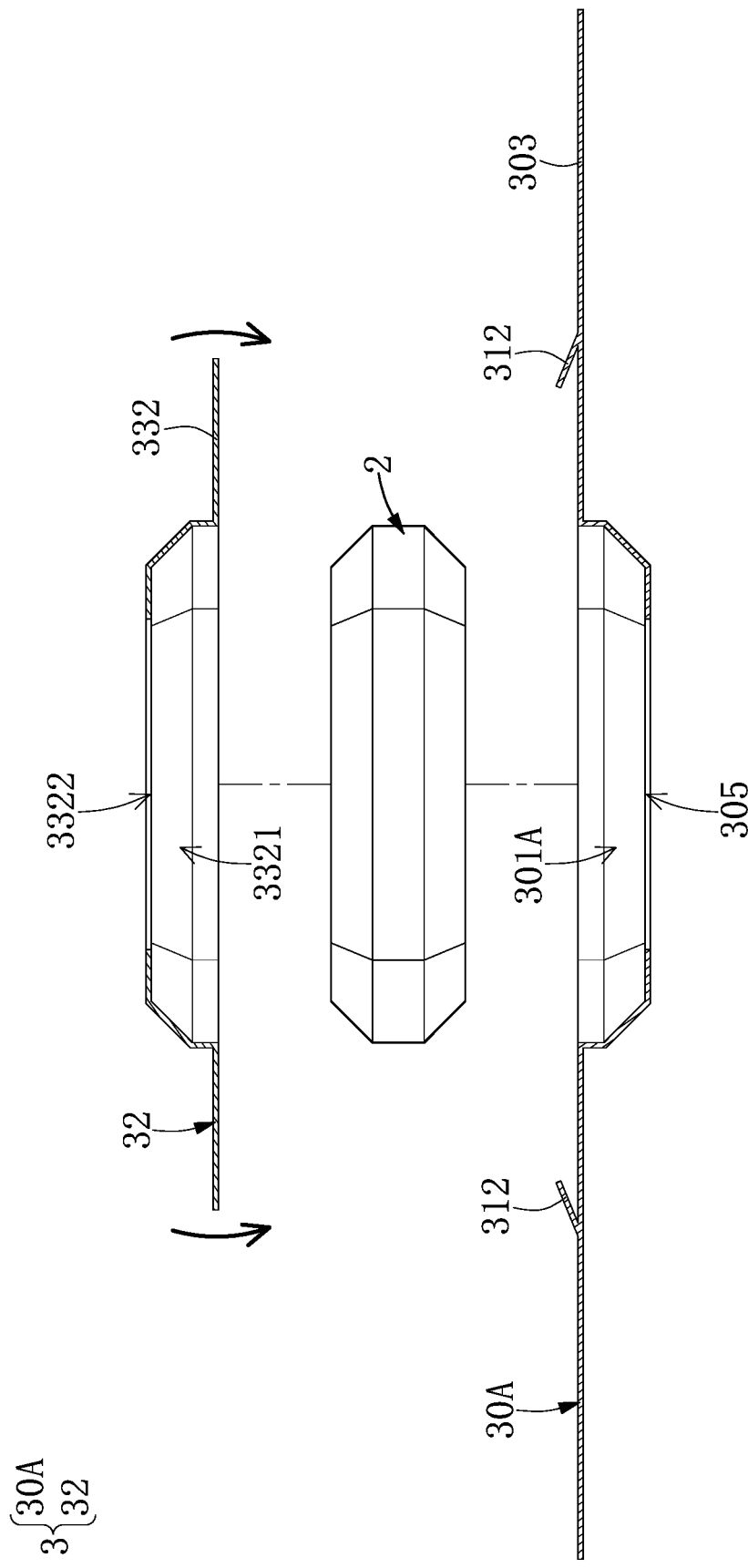
FIG. 31 and FIG. 32 are schematic views showing a process of a specimen carrier (non-sectional) and a carrier device (sectional) being assembled with each other according to a twelfth embodiment of the present disclosure.
Figure 32:
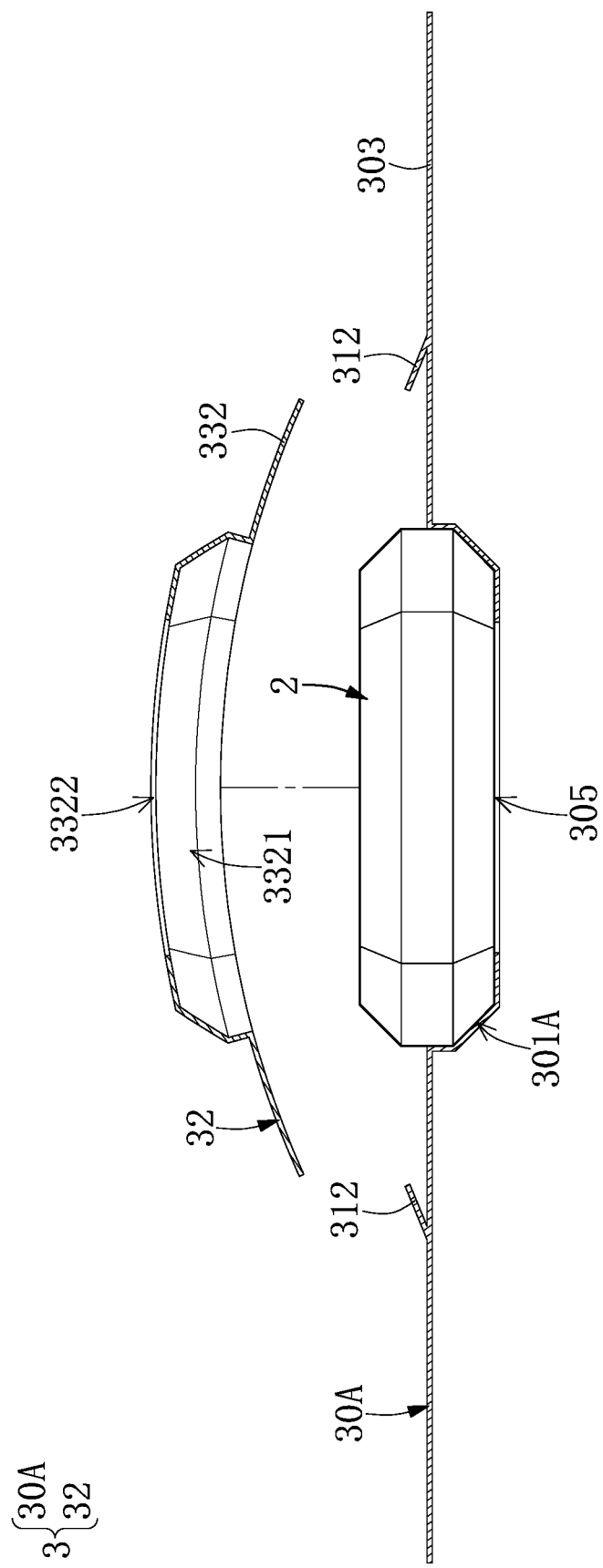
Figure 33:
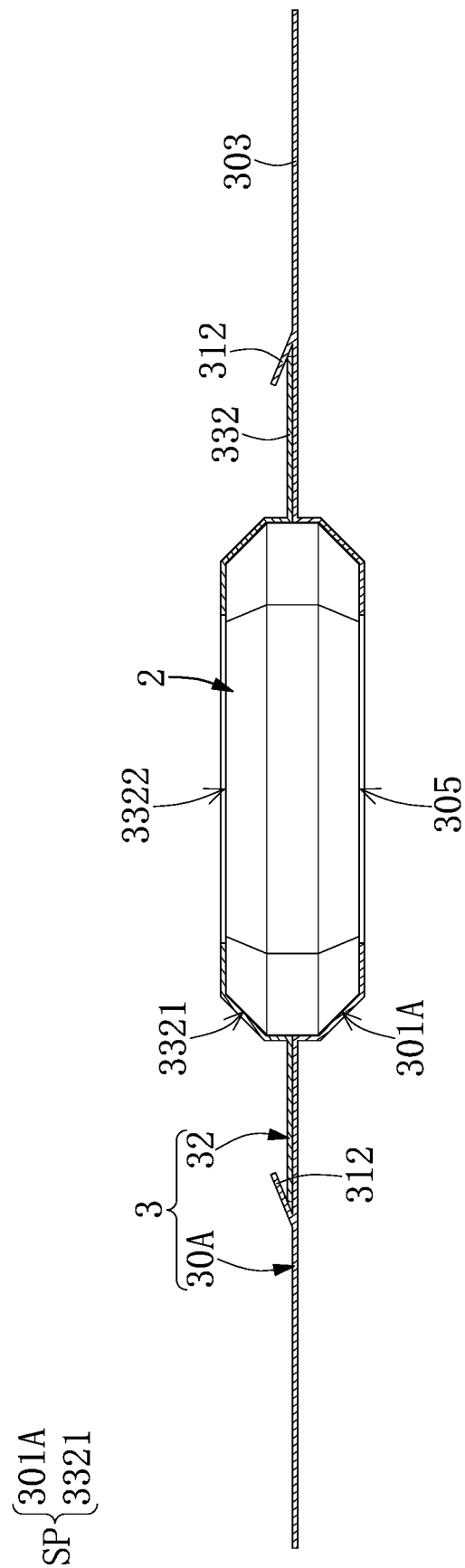
FIG. 33 is a schematic view showing the process of the specimen carrier (non-sectional) and the carrier device (sectional) being assembled with each other according to the twelfth embodiment of the present disclosure.

Reference is made to FIG. 31 to FIG. 33, which are schematic views showing the process of a specimen carrier (non-sectional) and a carrier device (sectional) being assembled with each other according to a twelfth embodiment of the present disclosure. The main difference between the twelfth embodiment and the previous embodiments is that the main body of the carrier device 3 is defined as a first main body 30A, and the containing groove of the carrier device 3 is defined as a first containing groove 301A. The limiting element 32 includes a second main body 332 having a second containing groove 3321 that is formed by being recessed on a side of the second main body 332. The second main body 332 has a second opening 3322, and the second containing groove 3321 can be in spatial communication with the outside through the second opening 3322.

The size and the shape of the second main body 332 and the second containing groove 3321 can be roughly the same as the size and the shape of the first main body 30A and the first containing groove 301. More specifically, the size of the observation port 305 of the first main body 30A and the size of the second opening 3322 of the second main body 332 are bigger than the size of the two observation grooves 20 at the two ends of the specimen carrier 2. The electron beam can enter and exit the specimen carrier 2 through the observation port 305 and the second opening 3322.

The first main body 30A further includes two auxiliary positioning structures 312 that are configured to fix to the second main body 332, and to limit a range of movement of the second main body 332 relative to the first main body 30A. More specifically, the two auxiliary positioning structures 312 can be integrally formed with the first main body 30A and be a sheet structure.

The two auxiliary positioning structures 312 can be disposed to approximately face each other, and the two auxiliary positioning structures 312 have a distance between each other that is less than an outer diameter of the second main body 332. That is, the second main body 332 is unable to be directly mounted on the side of the first main body 30A.

As shown in FIG. 31 and FIG. 32, when the second main body 332 is disposed on a side of the first main body 30A by the related personnel, the specimen carrier 2 can be disposed in the first containing groove 301A first, and the second main body 332 is bent. The bent second main body 332 is inserted in a space between the two auxiliary positioning structures 312 of the first main body 30A, and then the second main body 332 is no longer bent and returns to the state before being bent by its own elastic restoring force.

Accordingly, the second main body 332 fixedly abuts against the two auxiliary positioning structures 312. Regarding the quantity, shape, and assembling position of the two auxiliary positioning structures 312 included in the first main body 30A, all can be adjusted according to the size, the shape, etc. of the second main body 332. The quantity, shape, and assembling position of the two auxiliary positioning structures 312 shown in FIG. 31 and FIG. 32 of the present embodiment is only one of the exemplary configurations.

As shown in FIG. 33, when the second main body 332 is fixed on the side of the first main body 30A through the two auxiliary positioning structures 312 of the first main body 30A, the first containing groove 301A is in spatial communication with the second containing groove 3321 to form a combined containing groove SP, and the specimen carrier 2 is relatively disposed in the combined containing groove SP.

In exemplary embodiments, the size and the shape of the combined containing groove SP are relative to the size and the shape of the specimen carrier 2, but it is not limited thereto. As long as the combined containing groove SP can contain the specimen carrier 2, the size and the shape of the combined containing groove SP can be adjusted according to requirements.

Figure 34:
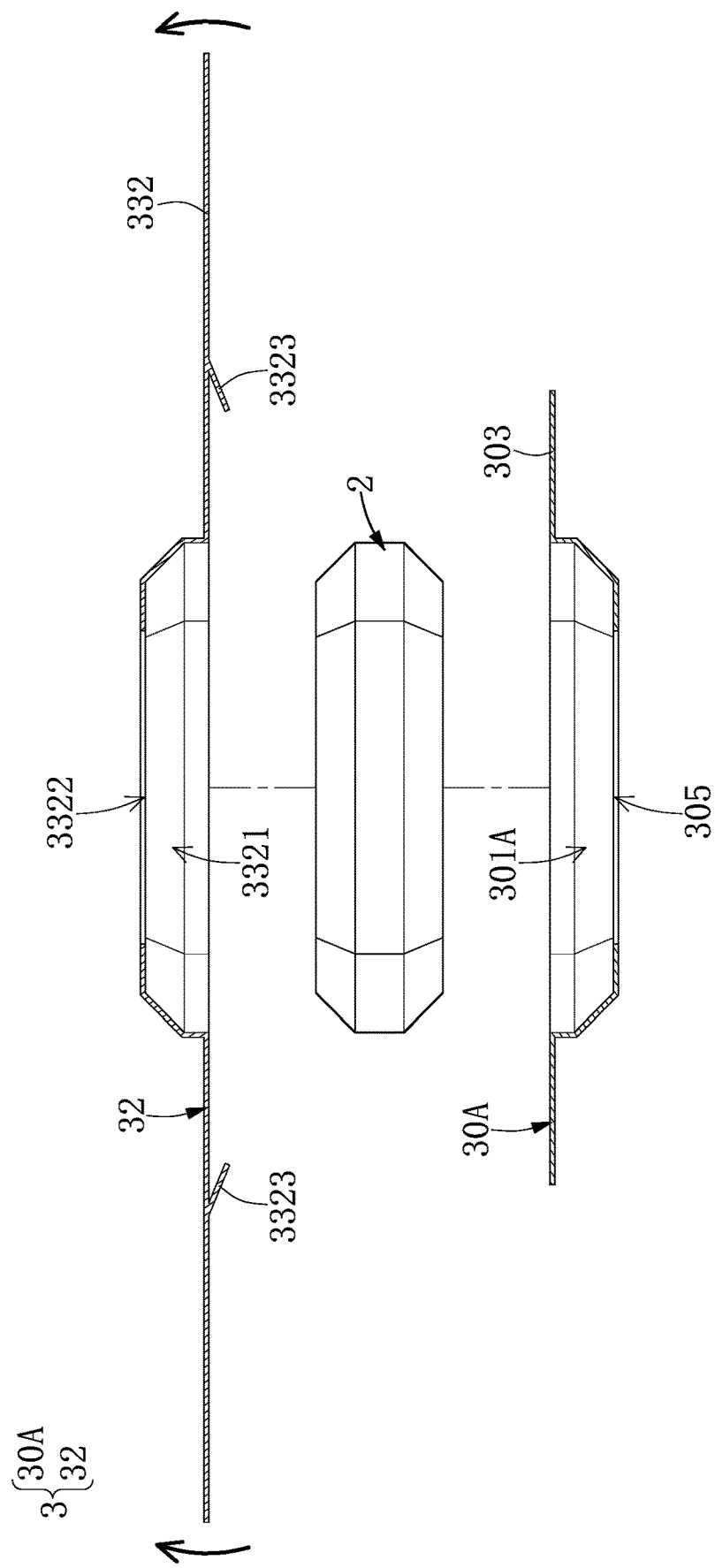
FIG. 34 and FIG. 35 are schematic views showing a process of a specimen carrier (non-sectional) and a carrier device (sectional) being assembled with each other according to a thirteenth embodiment of the present disclosure.
Figure 35:
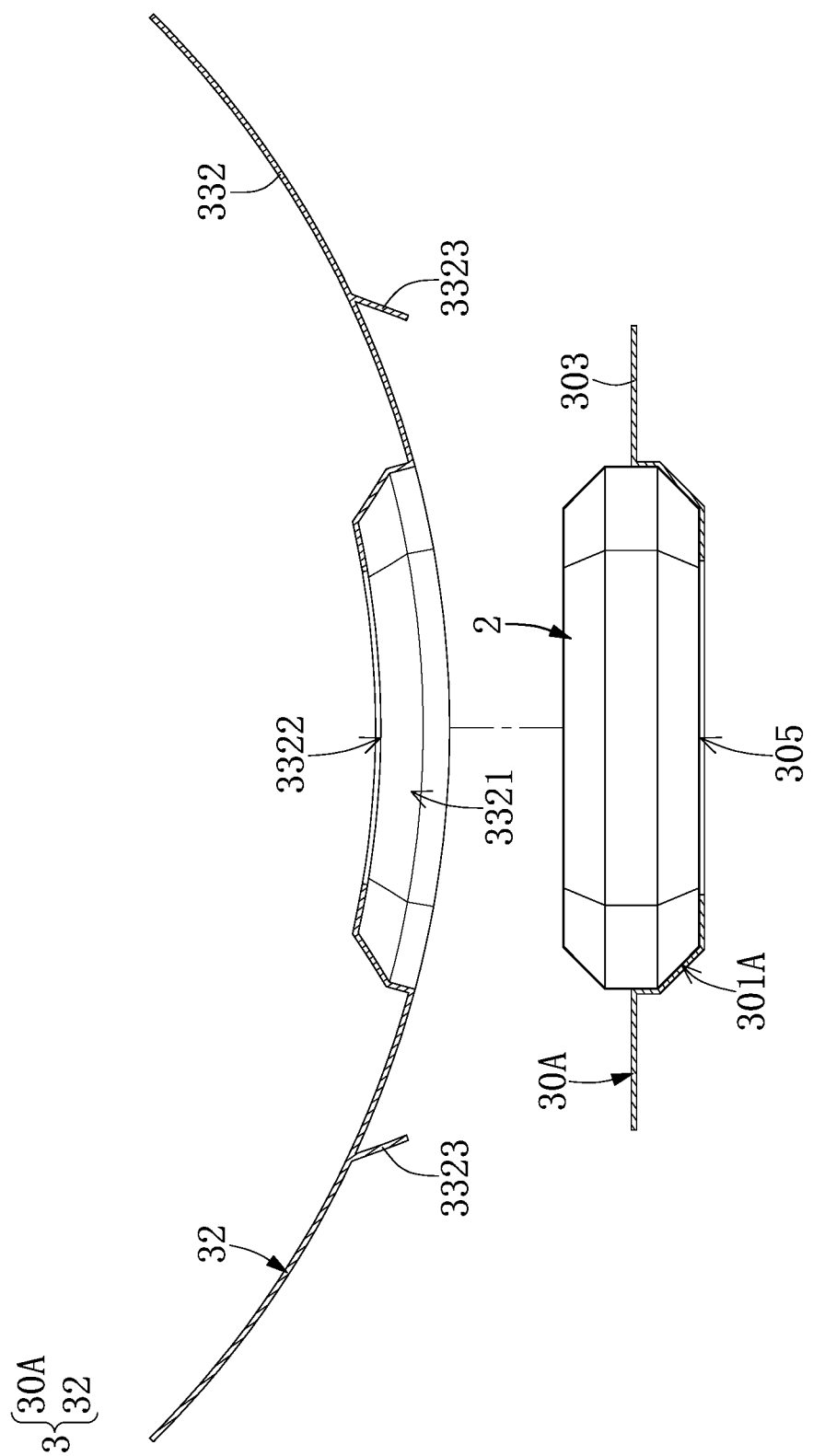

Referring to FIG. 34 and FIG. 35, FIG. 34 is an exploded view of a carrier device (sectional) carrying a specimen carrier (non-sectional) according to a thirteenth embodiment of the present disclosure, and FIG. 35 is an assembled view of the carrier device (sectional) carrying the specimen carrier (non-sectional) according to the thirteenth embodiment of the present disclosure.

The main difference between the thirteenth embodiment and the previous embodiments is that the first main body 30A can have no auxiliary positioning structure 312, and the second main body 332 has two auxiliary positioning structures 3323. When the second main body 332 is fixed on a side of the first main body 30A by the related personnel, the second main body 332 can be bent, so that the two auxiliary positioning structures 3323 of the second main body 332 bends in opposite directions to each other.

Accordingly, the two auxiliary positioning structures 3323 can clamp the first main body 30A, and the first main body 30A is jointly fixed by the second main body 332 and the two auxiliary positioning structures 3323 thereof.

It should be noted that the auxiliary positioning structures of the carrier device 3 in the twelfth embodiment and the thirteenth embodiment of the present disclosure is just one of the exemplary configuration. In practice, as long as one of the first main body 30A and the second main body 332 has at least one fixed structure, and the first main body 30A and the second main body 332 are fixed to each other through the fixed structure, thus the auxiliary positioning structures mentioned above should belong to one of the variations of the carrier device 3 of the twelfth embodiment and the thirteenth embodiment of the present disclosure.

Figure 36:
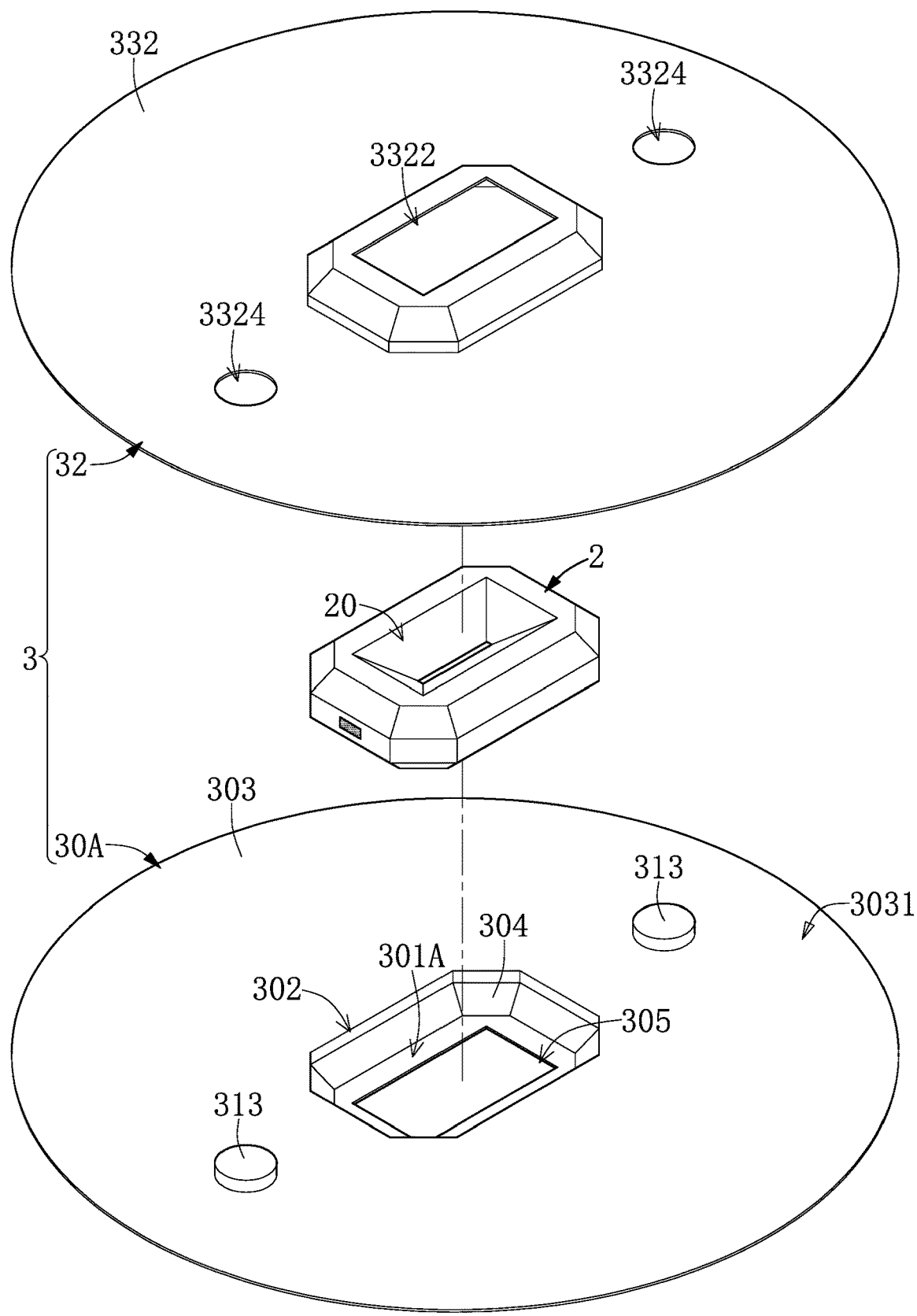
FIG. 36 is an exploded view of a carrier device carrying a specimen carrier according to a fourteenth embodiment of the present disclosure.
Figure 37:
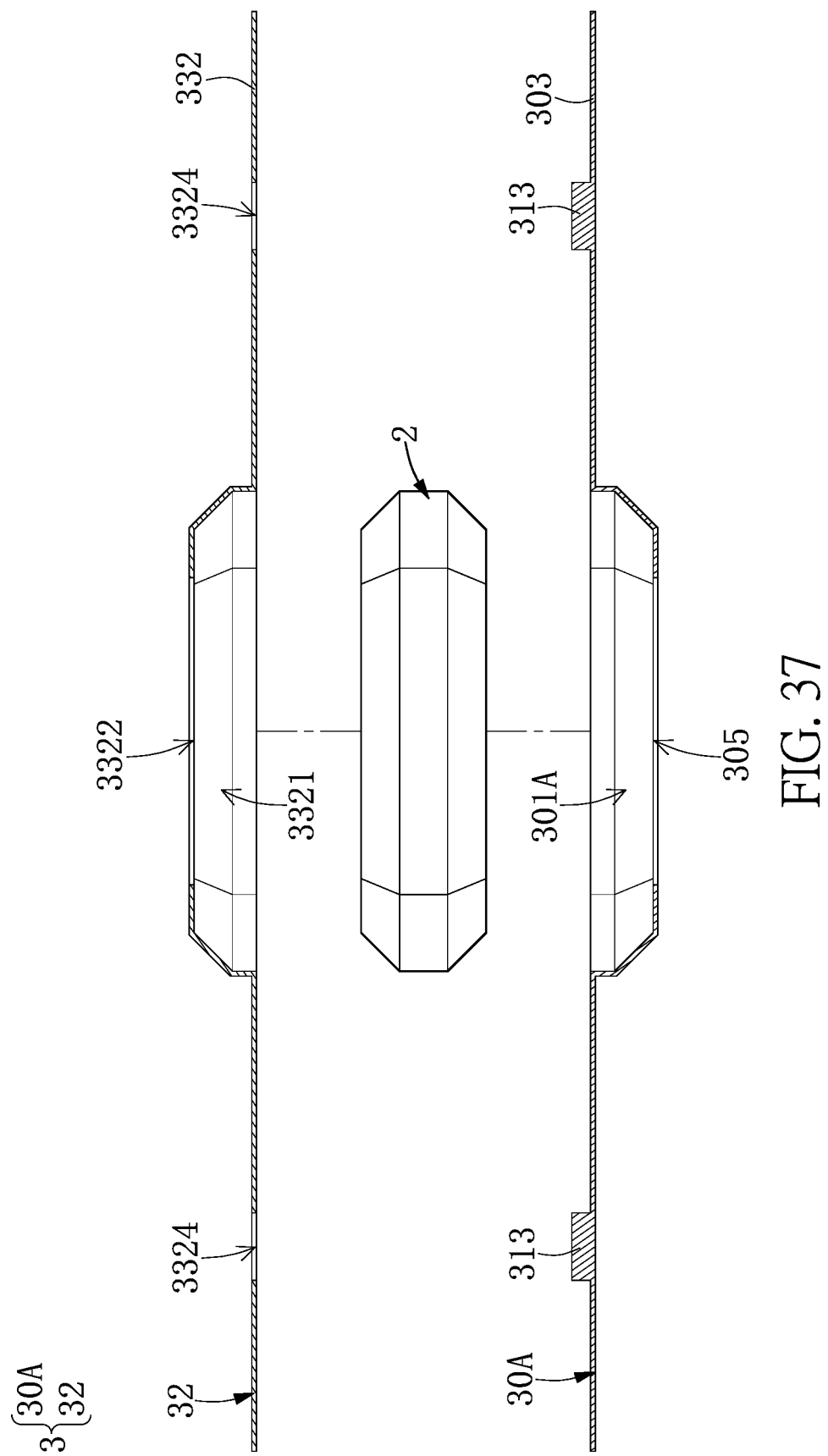
FIG. 37 and FIG. 38 are schematic views showing a process of the specimen carrier (non-sectional) and the carrier device (sectional) being assembled with each other according to the fourteenth embodiment of the present disclosure.
Figure 38:
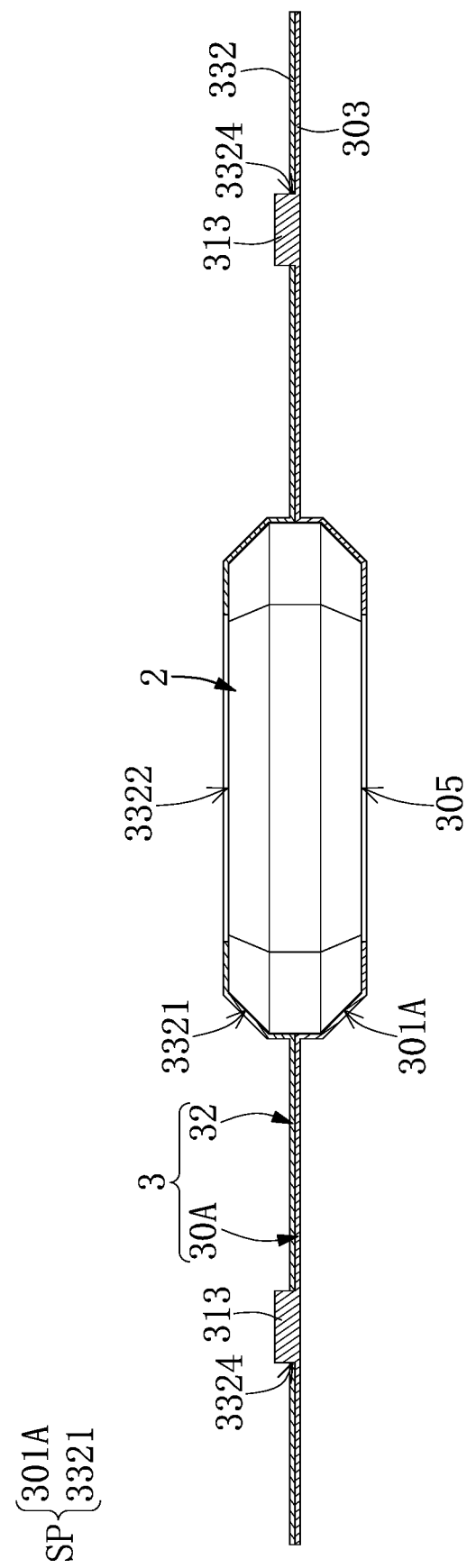

Referring to FIG. 36 to FIG. 38, FIG. 36 is an exploded view of a carrier device carrying a specimen carrier according to a fourteenth embodiment of the present disclosure, FIG. 37 is an exploded view of the carrier device (non-sectional) carrying the specimen carrier (sectional) according to the fourteenth embodiment of the present disclosure, and FIG. 38 is an assembled view of the carrier device (non-sectional) carrying the specimen carrier (sectional) according to the fourteenth embodiment of the present disclosure.

The main difference between the fourteenth embodiment and the previous embodiments is that the first main body 30A of the present embodiment does not have the two auxiliary positioning structures, and the first main body 30A of the present embodiment has two first limiting portions 313, and the second main body 332 has two second limiting portions 3324. The two first limiting portions 313 and the two second limiting portions 3324 can be respectively fixed to each other, so as to limit the range of movement of the first main body 30A relative to the second main body 332.

As shown in FIG. 36, each of the two first limiting portions 313 of the first main body 30A can be a convex column structure, and each of the two second limiting portions 3324 of the second main body 332 is a through hole (or a blind hole) relative to each of the two first limiting portions 313 of the first main body 30A. In other embodiments, each of the first limiting portions 313 can be the through hole (or the blind hole), and each of the second limiting portions 3324 can be the convex column structure.

More specifically, the first limiting portion 313 (or the second limiting portion 3324) being the convex column structure, for example, can be a cylindrical structure, hemispherical structure, etc., as long as the first limiting portion 313 (or the second limiting portion 3324) can engage with the second limiting portion 3324 (or the first limiting portion 313). The quantity, the shape, the size, and the assembling position of the first limiting portion 313 and the second limiting portion 3324 can be adjusted according to requirements.

As shown in FIG. 37 and FIG. 38, the first containing groove 301A and the second containing groove 3321 have roughly the same shape and size. When the first main body 30A and the second main body 332 are fixed to each other through the two first limiting portions 313 and the two second limiting portions 3324, the first containing groove 301A is in spatial communication with the second containing groove 3321 to form the combined containing groove SP, and the specimen carrier 2 is relatively contained in the combined containing groove SP.

In other embodiments, the quantity of the first limiting portion 313 and the quantity of the second limiting portion 3324 can be adjusted so that the shape of a part of the first limiting portion 313 and the shape of a part of the second limiting portion 3324 are different from the shape of the other part thereof to limit the first main body 30A to be disposed on the second main body 332 in a specific direction by the related personnel. For example, one of the first limiting portions 313 can be a circular through hole, the other one of the first limiting portions 313 can be a square through hole, and the two second limiting portions 3324 are respectively in the circular through hole and in the square through hole relative to the two first limiting portions 313.

Accordingly, the related personnel can be restricted to only allow the second main body 332 to be disposed on the first main body 30A in the specific direction. The first main body 30A can also have three of the first limiting portions 313, and two of the three first limiting portions 313 are located at an end of the first containing groove 301A, the other one of the three first limiting portions is located at the other end of the first containing groove 301A, and the second main body 332 has three of the second limiting portions 3324 relative to the three of the first limiting portions 313. Accordingly, the second main body 332 can be disposed on the first main body 30A in a correct direction.

Figure 39:
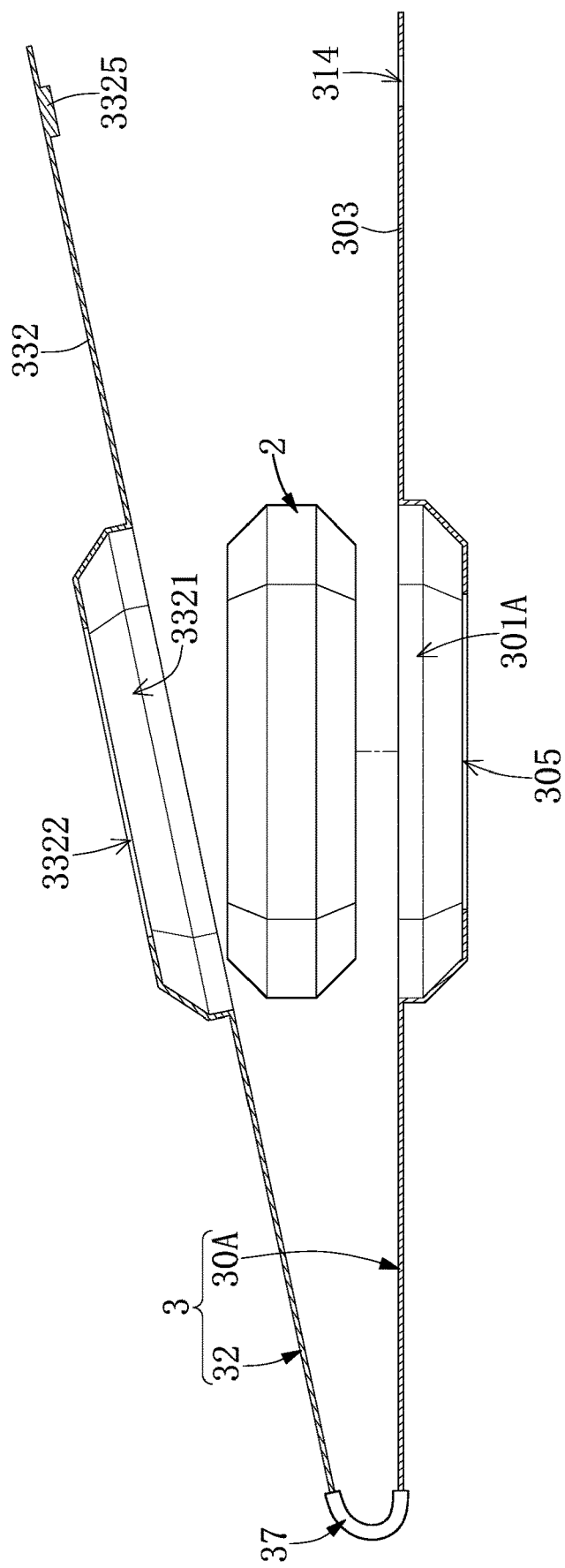
FIG. 39 is an exploded view of a carrier device (sectional) carrying a specimen carrier (non-sectional) according to a fifteenth embodiment of the present disclosure.

Reference is made to FIG. 39, which is an exploded view of a carrier device (sectional) carrying a specimen carrier (non-sectional) according to a fifteenth embodiment of the present disclosure. The main difference between the fifteenth embodiment and the previous embodiments is that the carrier device 3 further includes a curved structure 37 connected to the first main body 30A and the second main body 332, the second main body 332 is configured to rotate relative to the first main body 30A through the curved structure 37, so as to move in a direction that is close to or away from the first main body 30A.

The curved structure 37 can be any flexible structure and is connected to the first main body 30A and the second main body 332 in any manner. Regarding the position where the first main body 30A is connected to the curved structure 37 and the position where the second main body 332 is connected to the curved structure 37, it can be adjusted according to requirements, but it is not limited to FIG. 39 of the present disclosure.

It should be noted that the carrier device 3 of the previous embodiments is an example of a disc-shaped structure, but the shape of the first main body 30A of the present disclosure is not limited to the disc-shaped structure. The shape of the first main body 30A and the shape of the second main body 332 can be adjusted according to the assembling position that the curved structure 37 is disposed at. For example, the shape of the first main body 30A and the shape of the second main body 332 can be in a square shape.

Furthermore, in practice, the curved structure 37 can be an element that is additionally fixed on the first main body 30A and the second main body 332. The curved structure 37, the first main body 30A, and the second main body 332 can also be integrally formed with each other through a specific production process.

It is worth mentioning that in other embodiments, the first main body 30A can further include a first auxiliary positioning part 314, and the second main body 332 can include a second auxiliary positioning part 3325. The first auxiliary positioning part 314 and the second auxiliary positioning part 3325 can engage with each other. When the second auxiliary positioning part 3325 bends toward the first main body 30A through the curved structure 37 to be disposed on the first main body 30A, the second auxiliary positioning part 3325 and the first auxiliary positioning part 314 can engage with each other to limit the range of movement of the second main body 332 relative to the first main body 30A.

Accordingly, the second main body 332 can be secured to not easily move relative to the first main body 30A. In FIG. 39 according to the present embodiment, the first auxiliary positioning part 314 being the through hole and the second auxiliary positioning part 3325 being the protruding structure are taken as an example, but it is not limited thereto. The first auxiliary positioning part 314 and the second auxiliary positioning part 3325 can be any structures that can be engaged with each other.

Figure 40:
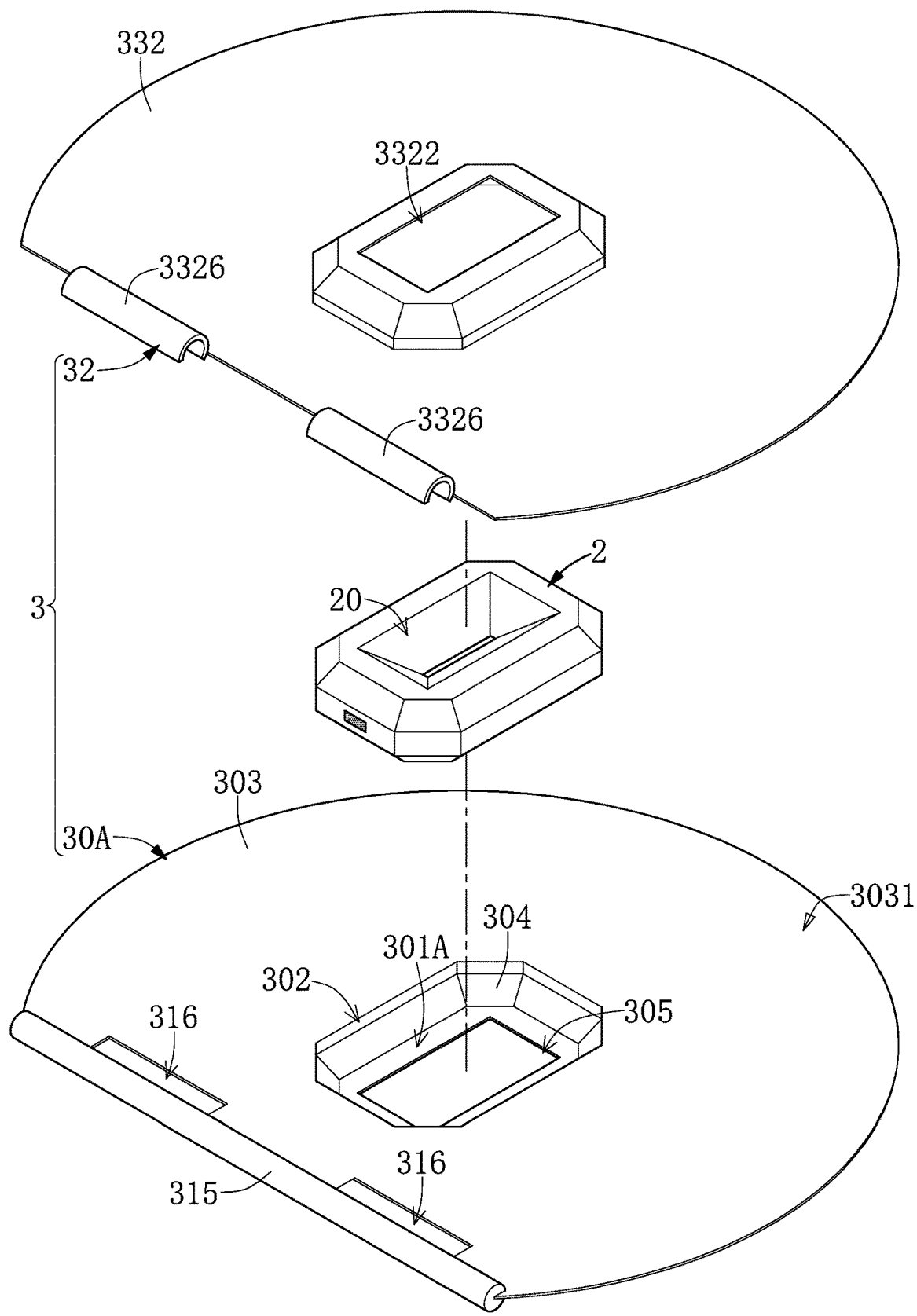
FIG. 40 is an exploded view of a carrier device according to a sixteenth embodiment of the present disclosure.

Reference is made to FIG. 40, which is an exploded view of a carrier device according to a sixteenth embodiment of the present disclosure. The main difference between the sixteenth embodiment and the fifteenth embodiments is that the first main body 30A further includes a first pivoting portion 315, and the second main body 332 further includes two second pivoting portions 3326 pivotally connected to the first pivoting portion 315. The second main body 332 can rotate relative to the first main body 30A.

More specifically, the first pivoting portion 315 of the first main body 30A can be in a cylindrical shape and has two avoiding through holes 316 formed on the location of the first main body 30A that is adjacent to the first pivoting portion 315. Each of the two second pivoting portions 3326 is in an arc structure and can engage with the first pivoting portion 315 being in the cylindrical shape.

More specifically, when the second main body 332 rotates relative to the first main body 30A, the two second pivoting portions 3326 being in the arc structure can pass through two of the avoiding through holes 316 and rotate relative to the first pivoting portion 315 being in the cylindrical shape. In the present embodiment, the second main body 332 having the two second pivoting portions 3326 being in the arc structure is taken as an example, but the quantity of the second pivoting portion 3326 of the second main body 332 is not limited to being two and can be adjusted according to the requirements.

Furthermore, in FIG. 40 of the present embodiment, the shape, the size, and the quantity of the first pivoting portion 315 and the two second pivoting portions 3326 are merely one of the exemplary configuration, in which the assembling positions where the first pivoting portion 315 and the two second pivoting portions 3326 are respectively disposed on the first main body 30A and the second main body 332 are also one of the exemplary configurations.

In practice, any one of structures that can enable the first main body 30A to rotate relative to the second main body 332 should belong to the applicable scope of the first pivoting portion 315 and the two second pivoting portions 3326 mentioned in this embodiment. It should be noted that in a special application, the first pivoting portion 315 and the two second pivoting portions 3326 can also cooperate with other components, so that the first main body 30A can rotate relative to the second main body 332.

In summary, since the carrier device 3 of the present disclosure does not need the use of glue, and the related personnel can simply use the relevant tools to dispose the specimen carrier 2 in the containing groove to finish the preparation of the specimen. Therefore, compared with the conventional technology of using the glue to fix the element carrying the liquid specimen to the copper grid, the carrier device 3 of the present disclosure has advantages of simple and fast operation and high specimen preparation yield.

In the conventional technology, the problem of glue flowing into the observation groove 20 of the specimen carrier 2 is likely to occur during the process of preparing specimen by the related personnel. Therefore, compared with the carrying device 3 of the present disclosure, the conventional technology has a relatively low production yield. Furthermore, compared with the conventional technology, the carrier device 3 of the present disclosure also has the advantages of low cost and high expandability (processing modules and electrical connection elements can be disposed in the carrier device according to requirements to increase the function of the carrier device), etc.

Figure 41:
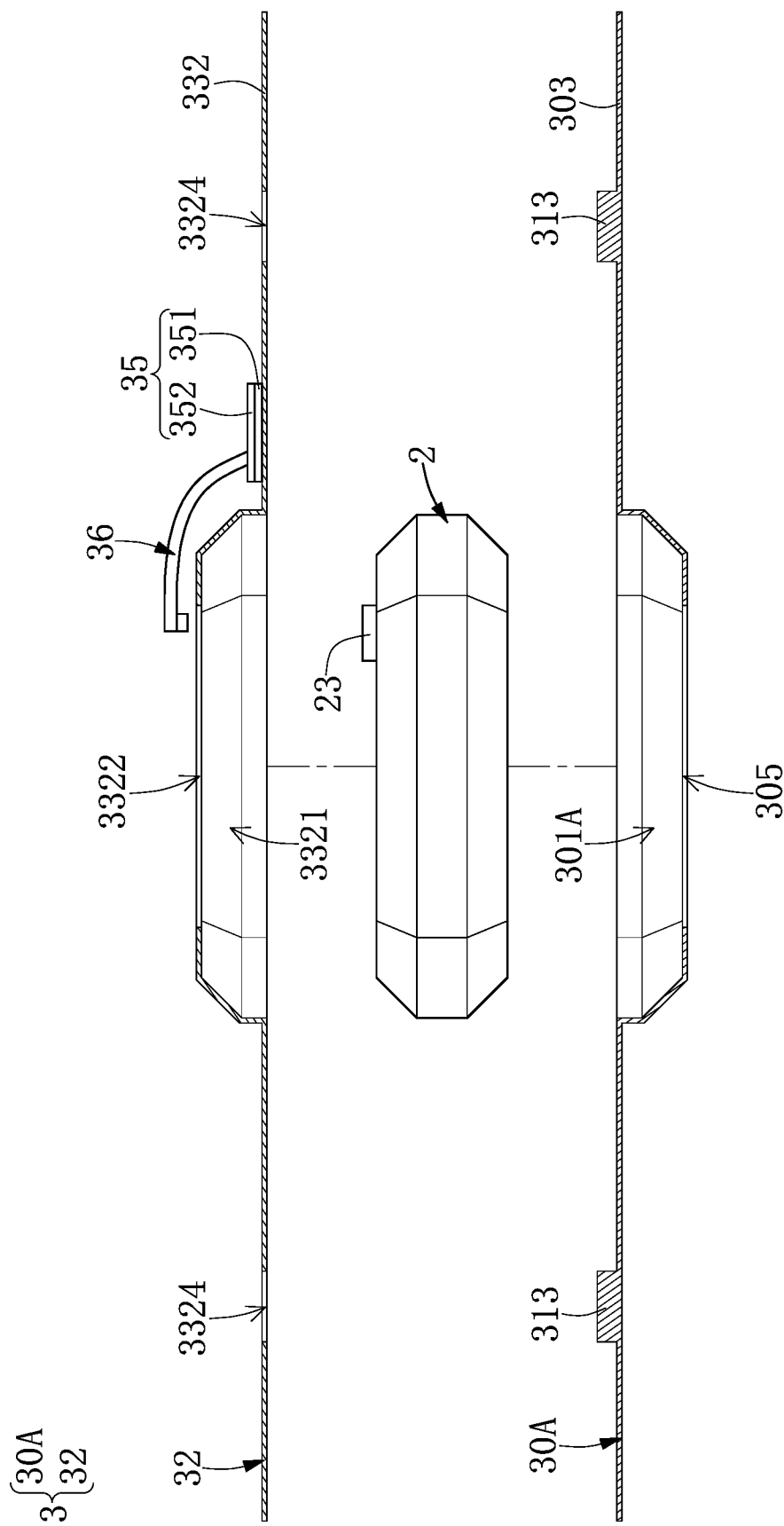
FIG. 41 is a schematic view showing a process of a specimen carrier (non-sectional) being disposed in a carrier device (sectional) according to a seventeenth embodiment of the present disclosure.

Reference is made to FIG. 41, which is an exploded view of a carrier device (sectional) carrying a specimen carrier according to a seventeenth embodiment of the present disclosure. The main difference between the seventeenth embodiment and the previous embodiments is that the second main body 332 is provided with the power supply unit 351 and the control unit 352 of the processing module 35, and an end of the electrical connection element 36 corresponds in position to the second opening 3322 of the second main body 332.

Figure 43:
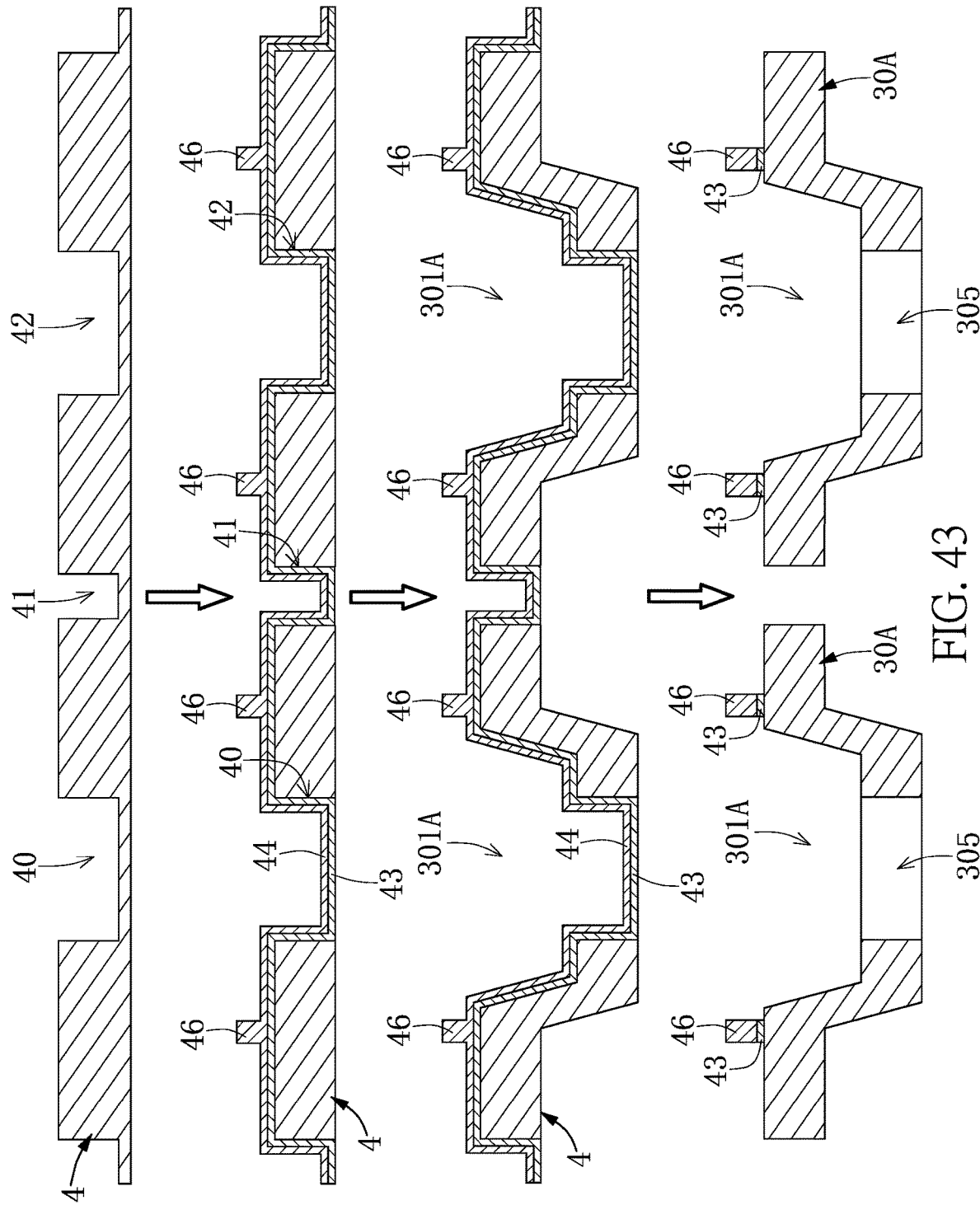
FIG. 43 and FIG. 44 are schematic views showing a process of a manufacturing method of a carrier device according to a second embodiment of the present disclosure.

As shown in FIG. 43, when the second main body 332 is disposed on a side of the first main body 30A, the end of the electrical connection element 36 can be connected to the electrical connection portion 23 disposed on the specimen carrier 2. Accordingly, the power supply unit 351 can provide the electricity needed when an electronic component inside of the specimen carrier 2 is in operation. The processing module 35 and the electrical connection element 36 mentioned in the present embodiment can be any one of the twelfth embodiment to the sixteenth embodiment applied to the abovementioned carrier device 3.

Figure 42:
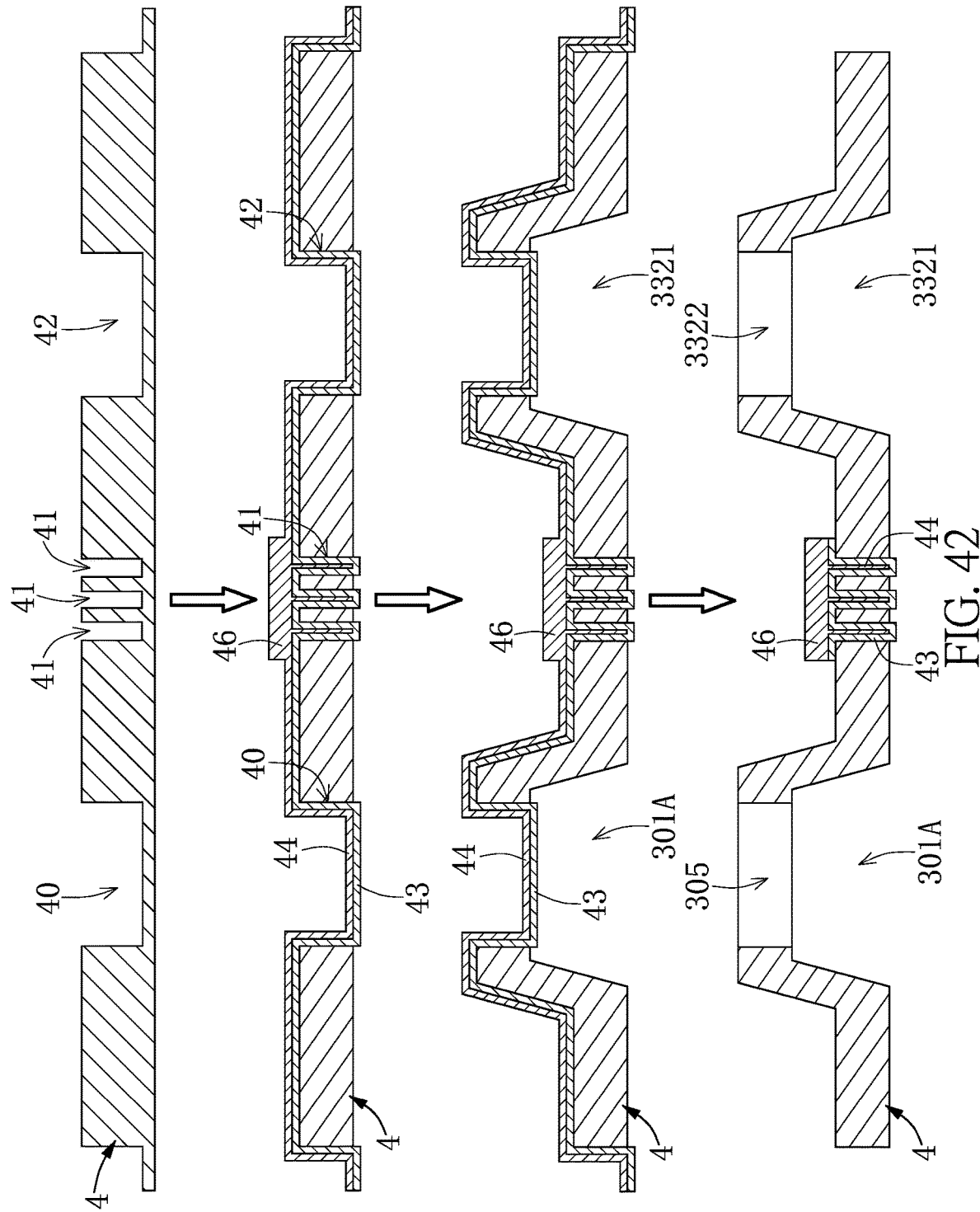
FIG. 42 is a schematic view showing a process of a manufacturing method of the carrier device according to a first embodiment of the present disclosure.

Reference is made to FIG. 42, which is a schematic view showing the process of a manufacturing method of the carrier device. The manufacturing method mentioned in this embodiment mainly manufactures the carrier device 3 that includes the first main body 30A and the second main body 332, and the manufacturing method of the present disclosure includes:

A surface cleaning step: cleaning a surface of a copper foil substrate 4;

A dry etching step (as shown in the top diagram in FIG. 42): dry etching the copper foil substrate 4 to form a first groove 40 on a side of the copper foil substrate 4, a plurality of intermediate grooves 41, and a second groove 42, in which the plurality of the intermediate grooves 41 are spaced apart from each other and are located between the first groove 40 and the second groove 42, and in which the first groove 40, each of the intermediate grooves 41 and the second groove 42 do not penetrate through the copper foil substrate 4;

A nickel-gold layer forming step: forming a nickel layer 43 on the side of the copper foil substrate 4 where the first groove 40, the plurality of the intermediate grooves 41 and the second groove 42 are formed, and then forming a gold layer 44 on the nickel layer 43;

A photoresist forming step: forming a photoresist layer on the gold layer 44 without forming the photoresist layer above the plurality of intermediate grooves 41;

An exposure development and electroplating step: using exposure and development technology to remove the gold layer 44 that is not shielded by the photoresist layer, and then plating an auxiliary gold layer 46 with a thicker thickness;

A protective film bonding step: forming a protective film on the gold layer 44 and the auxiliary gold layer 46;

A wet etching step: placing the copper foil substrate 4 in an etching solution so that the etching solution etches a side of the copper foil substrate 4 opposite to the side where the gold layer 44 is formed thereon, and then a part of the nickel layer 43 is exposed on the outside (as shown in the second diagram from top to bottom in FIG. 42);

A protective film removing step: removing the protective film on the gold layer 44;

A mold forming step: using an upper mold 5 and a lower mold 6 to press the copper foil substrate 4 so that a part of the copper foil substrate 4 is exposed from the nickel layer 43, and then bending a side of the copper foil substrate 4 that does not have the nickel layer 43 formed thereon toward a side of the copper foil substrate 4 that does have the nickel layer 43 formed thereon, so that the first containing groove 301A and the second containing groove 3321 are respectively formed on two sides of the plurality of the intermediate grooves 41 (as shown in the third diagram from top to bottom in FIG. 42). More specifically, the shape and the size of the first containing groove 301A are roughly the same as the shape and the size of the second containing groove 3321;

A hole-opening step: removing the nickel layer 43 and the gold layer 44 in the intermediate groove 41, leaving only the nickel layer 43, the gold layer 44 and the auxiliary gold layer 46 arranged in the intermediate groove 41 to form a single one of the observation port 305 and a single one of the second opening 3322, in which the first containing groove 301A can be in spatial communication with the outside through the single one of the observation port 305, and the second containing groove 3321 can be in spatial communication with the outside through the single one of the second opening 3322 (as shown in the fourth diagram from top to bottom in FIG. 42);

A bending step: bending the copper foil substrate 4 so that the first containing groove and the second containing groove face each other, and the multiple grooves and the nickel layer 43, the gold layer 44 and the auxiliary gold layer 46 formed therein serve as the curved structure 37 mentioned above.

As mentioned above, through the arrangement of the nickel layer 43, the gold layer 44 and the auxiliary gold layer 46 can be firmly fixed to the copper foil substrate 4. The gold layer 44 and the auxiliary gold layer 46 have relatively better deformability, which can allow the first main body 30A and the second main body 332 to be close to or away from each other when the related personnel performs the manufacturing method of the carrier device.

In other embodiments, the above-mentioned manufacturing method can exclude the protective film bonding step and the protective film removing step. Furthermore, only a partial section of the copper foil substrate 4 is shown in FIG. 42 of the present embodiment. In practice, the above-mentioned manufacturing method can form a plurality of the carrier devices 3 on a single one of the copper foil substrates 4.

It should be noted that in practical applications, the shape and the size of the upper mold 5 and the lower mold 6 can be adjusted according to the shape and the size of the actual specimen carrier 2. The size and the shape of elements in the manufacturing method of the carrier device shown in FIG. 42 of the present embodiment are only one of the configurations.

Figure 44:
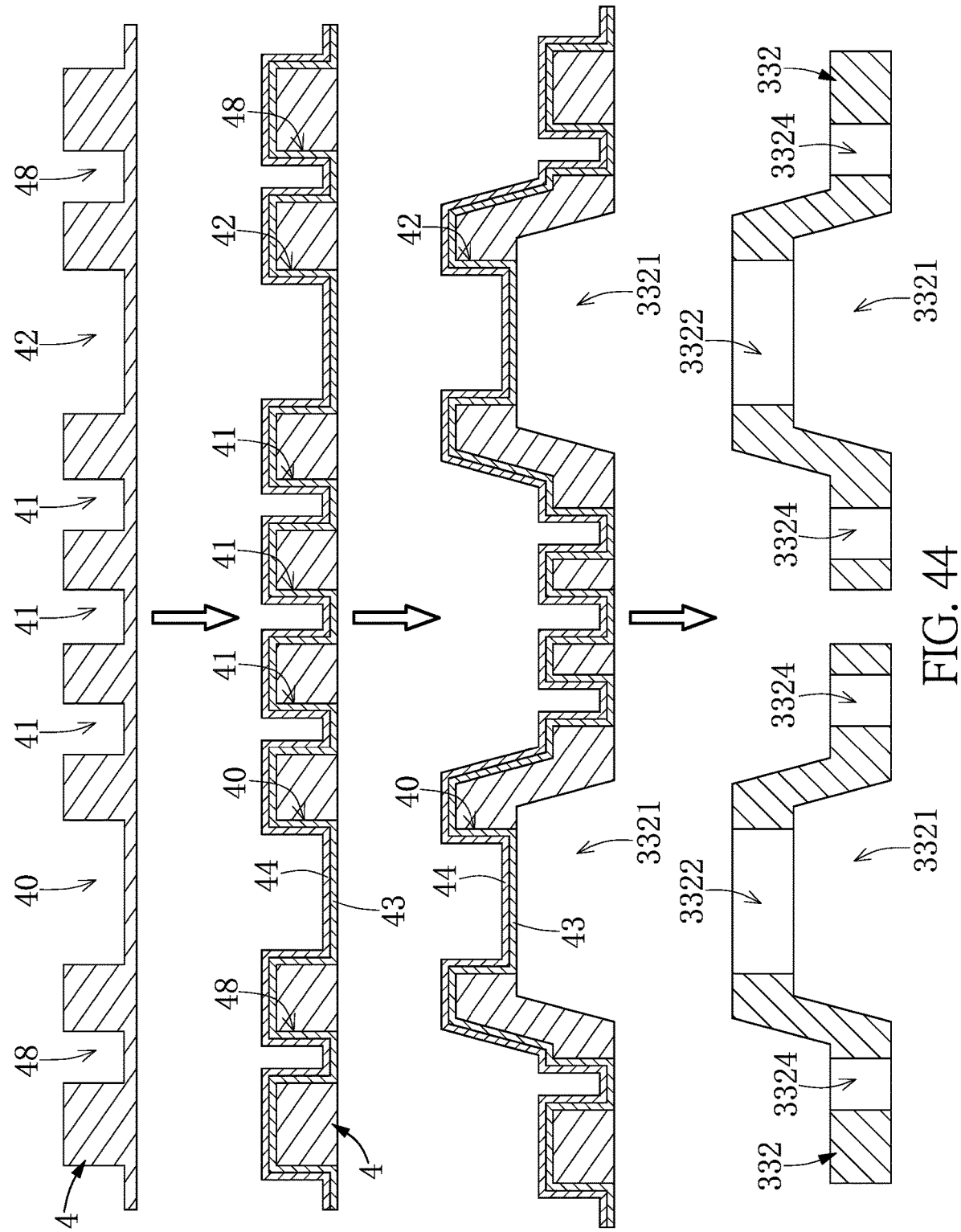
Figure 45:
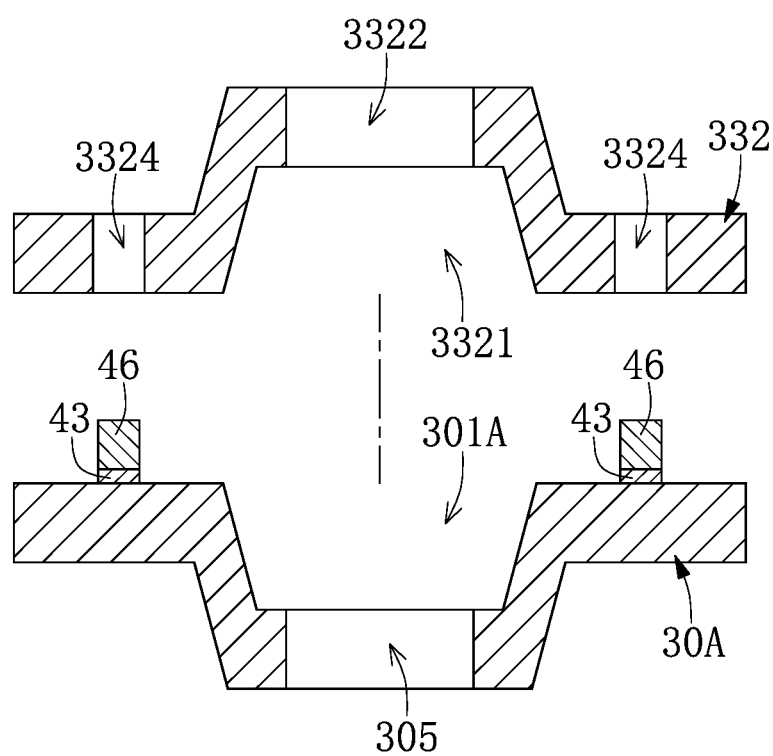
FIG. 45 is a sectional view of the carrier device manufactured by the manufacturing method of the carrier device according to the second embodiment of the present disclosure.

Referring to FIG. 43 to FIG. 45, FIG. 43 is a schematic view of a manufacturing method of the first main body (or the second main body) of the carrier device of the present disclosure. FIG. 44 is a schematic view of the manufacturing method of the second main body (or the first main body) of the carrier device of the present disclosure. FIG. 45 is a schematic view of two carrier devices manufactured by the manufacturing methods respectively in FIG. 43 and in FIG. 44.

As shown in FIG. 43, the manufacturing method of the first main body (or the second main body) of the carrier device of the present disclosure includes:

a surface cleaning step: cleaning a surface of a copper foil substrate 4;

A dry etching step (as shown in the uppermost diagram in FIG. 43): dry etching the copper foil substrate 4 to form a first groove 40, an intermediate groove 41 and a second groove 42 on a side of the copper foil substrate 4, in which the intermediate groove 41 is located between the first groove 40 and the second groove 42, in which the first groove 40, the intermediate groove 41 and the second groove 42 do not penetrate through the copper foil substrate 4;

A nickel-gold layer forming step: forming a nickel layer 43 on the side of the copper foil substrate 4 where the first groove 40, the intermediate groove 41 and the second groove 42 are formed, and then forming a gold layer 44 on the nickel layer 43;

A photoresist forming step: forming a photoresist layer (not shown) on the gold layer 44, not forming the photoresist layer on the gold layer 44 located on two sides of the intermediate groove 41, not forming the photoresist layer on the gold layer 44 located next to the first groove 40, and not forming the photoresist layer on the gold layer 44 next to the second groove 42;

An exposure development and electroplating step: removing the gold layer 44 that is not shielded by the photoresist layer, and then plating an auxiliary gold layer 46 by exposure and development technology, in which the auxiliary gold layer 46 is a columnar structure (as shown in the second diagram from top to bottom in FIG. 43);

A protective film bonding step: forming a protective film (not shown) on the gold layer 44 and the auxiliary gold layer 46;

A wet etching step: placing the copper foil substrate 4 in an etching solution so that the etching solution etches a side of the copper foil substrate 4 opposite to the side where the gold layer 44 is formed, and then a part of the nickel layer 43 is exposed on the outside;

A protective film removing step: removing the protective film on the gold layer 44;

A mold forming step: using an upper mold 5 and a lower mold 6 to press the copper foil substrate 4 so that a part of the copper foil substrate 4 is exposed from the nickel layer 43, bending a side of the copper foil substrate 4 that does not have the nickel layer 43 formed thereon toward a side of the copper foil substrate 4 that does have the nickel layer 43 formed thereon, so that two of the first containing grooves 301A are respectively formed on two sides of the intermediate groove 41 (as shown in the third diagram from top to bottom in FIG. 43). More specifically, the shape and the size of the two first containing grooves 301A are roughly the same as each other; and A hole-opening step: except for each of the auxiliary gold layer 46 and the nickel layer 43 connected to each of the auxiliary gold layer 46, removing the other gold layer 44 and the nickel layer 43 to form a single one of the observation port 305, in which each of the first containing grooves 301A can be in spatial communication with the outside through the observation port 305 (as shown in the fourth diagram from top to bottom in FIG. 43);

As shown in the fourth diagram from top to bottom in FIG. 43, a plurality of the first main bodies 30A of the plurality of carrier devices 3 of the present disclosure can be manufactured through the manufacturing method mentioned above. In other embodiments, the above-mentioned manufacturing method can exclude the protective film bonding step and the protective film removing step. Furthermore, the shape and the size of the upper mold 5 and the lower mold 6 can be adjusted according to the shape and the size of the actual specimen carrier 2, and it is not limited to FIG. 43 of the present embodiment.

As shown in FIG. 44, the manufacturing method of the second main body (or the first main body) of the carrier device of the present disclosure includes:

A surface cleaning step: cleaning a surface of a copper foil substrate 4;

A dry etching step (as shown in the top diagram in FIG. 44): dry etching the copper foil substrate 4 to form a first groove 40, an intermediate groove 41, a second groove 42, and four reserved grooves 48 on a side of the copper foil substrate 4, in which the intermediate groove 41 is located between the first groove 40 and the second groove 42, in which two of the reserved grooves 48 are located on two sides of the first groove 40, and the other two of the reserved grooves 48 are located on two sides of the second groove 42, in which, the first groove 40, the intermediate groove 41, the second groove 42 and each of the four reserved grooves 48 do not penetrate through the copper foil substrate 4;

A nickel-gold layer forming step: forming a nickel layer 43 on the side of the copper foil substrate 4 where the first groove 40, the intermediate groove 41 and the second groove 42 are formed, and then forming a gold layer 44 on the nickel layer 43;

A wet etching step: placing the copper foil substrate 4 in an etching solution so that the etching solution etches a side of the copper foil substrate 4 opposite to the side where the gold layer 44 is formed, and then a part of the nickel layer 43 is exposed on the outside (as shown in the second diagram from top to bottom in FIG. 44);

A mold forming step: using an upper mold 5 and a lower mold 6 to press the copper foil substrate 4 so that the copper foil substrate 4 located between the two reserved grooves 48 is bent from one side of the copper foil substrate 4 where the nickel layer 43 is not formed toward the other side of the copper foil substrate 4 to form two second containing grooves (as shown in the third diagram from top to bottom in FIG. 42);

A hole-opening step: removing the entire nickel layer 43 and the entire gold layer 44 to form two second openings 3322, and each of the two second containing grooves 3321 can be in spatial communication with the outside through one of the second openings 3322 (as shown in the fourth diagram from top to bottom in FIG. 44);

As shown in FIG. 44, a plurality of the second main body 332 of the plurality of the carrier devices 3 of the present disclosure can be manufactured through the above manufacturing method. In other embodiments, the above-mentioned manufacturing method can exclude the protective film bonding step and the protective film removing step. Furthermore, the shape and the size of the upper mold 5 and the lower mold 6 can be adjusted according to the size and the shape of the actual specimen carrier 2, and it is not limited to FIG. 44 of the present embodiment.

As shown in FIG. 45, the first main body 30A and the second main body 332 manufactured through the above-mentioned manufacturing method can be directly packaged and sold as products. Furthermore, the first main body 30A and the second main body 332 manufactured through the above-mentioned manufacturing method respectively correspond in position to the first limiting portion (i.e., the auxiliary gold layer 46 and the nickel layer 43 shown in FIG. 45) and the second limiting portion 3324. The related personnel can use the first limiting portion and the second limiting portion 3324 to fix the first main body 30A and the second main body 332 to each other.

As mentioned above, the carrier device 3 mentioned in the previous embodiments can be manufactured by, for example, precision machining and electroplating, semiconductor, and micro-electromechanical technology in practice, but it is not limited thereto. Furthermore, the material of the main body 30 of the carrier device 3 can be, for example, copper, aluminum, nickel, gold, platinum, tin, ceramic, plastic, or silicon, but it is not limited thereto. The material of the limiting element 32 can be, for example, copper, aluminum, nickel, gold, platinum, tin, silicon, silicon carbide, aluminum nitride, polymer, rubber, acrylic, etc.

It should be noted that the carrier device 3 mentioned in the previous embodiments can be sold separately, and the carrier device 3 mentioned in the previous embodiments can also be sold together with the specimen carrier 2 to form a carrier kit. In other words, the carrier kit of the present disclosure includes the specimen carrier 2 and the carrier device 3.

In conclusion, the carrier device and the carrier kit of the present disclosure allows the specimen carrier to be stably fixed on the main body without using glue through the design of the main body and the at least one limiting element. Accordingly, the carrier device and the carrier kit of the present disclosure can solve the problems in the conventional technology, such as the glue contamination of the specimen or the glue contamination of the element that are likely to occur and interfere the specimen observation when the glue is used to fix the element configured to carry the liquid specimen.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A carrier device being configured to be fixedly disposed on a specimen holder of an electron microscope equipment and being configured to carry a specimen carrier, wherein the specimen carrier has two observation grooves respectively recessed on two opposite sides thereof and a containing channel that is formed therein and is configured to receive a specimen, and each of the two observation grooves is configured to expose a part of the containing channel, the carrier device comprising:

a main body having a containing groove recessed on a side thereof and an observation port that is in spatial communication with the containing groove, wherein the containing groove is configured to receive the specimen carrier, and wherein when the specimen carrier is disposed in the containing groove, one of the observation grooves is exposed from the main body through the observation port; and at least one limiting element disposed on the main body, wherein the limiting element is configured to limit a range of movement of the specimen carrier disposed in the containing groove relative to the main body.

2. The carrier device according to claim 1, wherein the main body includes a sheet structure and a support structure, the sheet structure is in a disc-shape and has two opposite sides respectively defined as a top surface and a bottom surface, and wherein the support structure is formed by extending outward from the bottom surface of the sheet structure, and the observation port of the main body is formed on a side of the support structure that is away from the sheet structure.

3. The carrier device according to claim 2, wherein the main body has an auxiliary containing structure formed by extending from a side of the main body that is opposite to a side of the main body forming the support structure, wherein the auxiliary containing structure and the support structure jointly form the containing groove configured to receive the entire specimen carrier, and wherein the at least one limiting element is movably disposed on the main body and is configured to be operated to cover the auxiliary containing structure, so as to limit the range of movement of the specimen carrier disposed in the containing groove relative to the main body.

4. The carrier device according to claim 1, wherein the containing groove has a depth less than a height of the specimen carrier, and when the specimen carrier is disposed in the containing groove, a part of the specimen carrier is exposed from the main body, wherein a quantity of the at least one limiting element of the carrier device is two, the main body has a containing opening corresponding in position to the containing groove, and the specimen carrier is configured to be disposed in the containing groove through the containing opening, and wherein in a top view of the carrier device, each of the two limiting elements has a part located in the containing opening.

5. The carrier device according to claim 4, wherein the two limiting elements are arranged to face each other, and each of the two limiting elements is integrally formed with the main body, and wherein the main body is bendable when being operated, and when the main body is in the process of being bent, a distance between the two limiting elements changes relatively.

6. The carrier device according to claim 1, wherein the containing groove has a depth less than a height of the specimen carrier, and when the specimen carrier is disposed in the containing groove, a part of the specimen carrier is exposed from the main body, wherein the main body has at least one through hole in a C-shape, and a part of the main body surrounded by the at least one through hole is defined as the at least one limiting element, such that the at least one limiting element is configured to be bendable when being operated relative to the main body.

7. The carrier device according to claim 1, wherein the containing groove has a depth less than a height of the specimen carrier, and when the specimen carrier is disposed in the containing groove, a part of the specimen carrier is exposed from the main body, and wherein the at least one limiting element is fixed on the main body, a side of the at least one limiting element opposite to a side thereof disposed on the main body is configured to be bendable when being operated relative to the main body, so as to abut against a side of the specimen carrier in the containing groove.

8. The carrier device according to claim 1, wherein the containing groove has a depth less than a height of the specimen carrier, and when the specimen carrier is disposed in the containing groove, a part of the specimen carrier is exposed from the main body, wherein a quantity of the at least one limiting element of the carrier device is two, and the two limiting elements are arranged to face each other, and wherein when the specimen carrier is in the process of being disposed in the containing groove, the two limiting elements are squeezed through the specimen carrier so that the two limiting elements are elastically deformed.

9. The carrier device according to claim 1, wherein the containing groove has a depth less than a height of the specimen carrier, and when the specimen carrier is disposed in the containing groove, a part of the specimen carrier is exposed from the main body, wherein the at least one limiting element includes a fixed base fixed on the main body and a flexible structure that is configured to be operated to bend in a direction that is close to or away from the containing groove, and wherein an end of the flexible structure is configured to abut against a side of the specimen carrier disposed in the containing groove, so as to limit the range of movement of the specimen carrier in the containing groove relative to the main body.

10. The carrier device according to claim 1, wherein the containing groove has a depth less than a height of the specimen carrier, and when the specimen carrier is disposed in the containing groove, a part of the specimen carrier is exposed from the main body, wherein the at least one limiting element includes a pivoting portion rotatably connected to the main body and an abutting portion that is connected to the pivoting portion, wherein the abutting portion is configured to rotate with the pivoting portion relative to the main body, wherein when the at least one limiting element is operated to rotate relative to the main body, and the abutting portion is arranged on the containing groove, the abutting portion abuts against the specimen carrier disposed in the containing groove, and wherein the pivoting portion is centered on a central axis parallel to a normal direction of the main body and rotates relative to the main body.

11. The carrier device according to claim 1, wherein the at least one limiting element includes a sliding portion and an abutting portion, the sliding portion is configured to move on a top surface of the main body in a direction that is close to or away from the containing groove, and wherein the abutting portion is connected to the sliding portion, and the abutting portion and the sliding portion are configured to move relative to the main body together.

12. The carrier device according to claim 11, wherein the main body includes a track structure having a track channel, and the sliding portion of the at least one limiting element is movably disposed in the track channel of the track structure.

13. The carrier device according to claim 12, wherein the main body further includes a stop structure located at an end of the track structure and is configured to limit the sliding portion from departing from the track structure.

14. The carrier device according to claim 1, wherein the main body includes a fixed hole, and the at least one limiting element includes an insertion portion inserting into the fixed hole and an abutting portion that is connected to the insertion portion, and wherein when the insertion portion inserts into the fixed hole, the abutting portion abuts against the specimen carrier disposed in the containing groove.

15. The carrier device according to claim 14, wherein the at least one limiting element further includes a pressing portion that abuts against a top surface of the main body, and wherein the specimen holder has a specimen holding element, and when the carrier device is disposed in the specimen holder, the specimen holding element of the specimen holder presses against the pressing portion, so as to limit the range of movement of the at least one limiting element relative to the main body.

16. The carrier device according to claim 1, wherein the carrier device further includes a processing module fixedly disposed on the main body and an electrical connection element that is connected to the processing module, wherein the processing module includes a power supply unit configured to store electricity and a control unit that is electrically connected to the power supply unit, wherein the electrical connection element has an end that is opposite to an end thereof that is connected to the processing module, and the specimen carrier has an electrical connection portion and an electronic component, wherein the end of the electrical connection element being opposite to the end thereof that is connected to the processing module is configured to be connected to the electrical connection portion of the specimen carrier, and wherein when the specimen carrier is fixedly disposed in the containing groove, and the electrical connection element is connected to the electrical connection portion of the specimen carrier, the power supply unit is configured to provide the electricity needed when the control unit is in operation, and the power supply unit is configured to provide the electricity needed when the electronic component inside of the specimen carrier is in operation.

17. The carrier device according to claim 1, wherein the main body includes a first engagement structure, and the at least one limiting element includes a second engagement structure and an abutting portion, wherein the second engagement structure of the at least one limiting element is configured to engage with the first engagement structure, and the abutting portion is connected to the second engagement structure, and wherein the abutting portion is configured to limit the range of movement of the specimen carrier disposed in the containing groove relative to the main body.

18. The carrier device according to claim 1, wherein the main body of the carrier device is defined as a first main body, and the containing groove of the carrier device is defined as a first containing groove, wherein the at least one limiting element includes a second main body having a second containing groove that is formed by being recessed on a side of the second main body, wherein at least one of the first main body and the second main body has a fixed structure configured to fixedly dispose the second main body on a side of the first main body, wherein when the second main body is fixedly disposed on the side of the first main body, the first containing groove is in spatial communication with the second containing groove to jointly form a combined containing groove, and wherein the combined containing groove is configured to receive the specimen carrier, and the specimen carrier disposed in the combined containing groove is jointly fixed by the first main body and the second main body.

19. The carrier device according to claim 1, wherein the main body of the carrier device is defined as a first main body, and the containing groove of the carrier device is defined as a first containing groove, wherein the at least one limiting element includes a second main body having a second containing groove that is formed by being recessed on a side of the second main body, wherein the first main body has two auxiliary positioning structures configured to fix the second main body so that the second main body is fixedly disposed on a side of the first main body, wherein when the second main body is fixedly disposed on the side of the first main body, the first containing groove is in spatial communication with the second containing groove to jointly form a combined containing groove, and wherein the combined containing groove is configured to receive the specimen carrier, and the specimen carrier disposed in the combined containing groove is jointly fixed by the first main body and the second main body.

20. The carrier device according to claim 1, wherein the main body of the carrier device is defined as a first main body, and the containing groove of the carrier device is defined as a first containing groove, wherein the at least one limiting element includes a second main body having a second containing groove that is formed by being recessed on a side of the second main body, wherein the first main body has at least one first limiting portion, the second main body has at least one second limiting portion, and the at least one first limiting portion and the at least one second limiting element are configured to be jointly fixed to each other so that the second main body is fixedly disposed on a side of the first main body, wherein when the second main body is fixedly disposed on the side of the first main body, the first containing groove is in spatial communication with the second containing groove to jointly form a combined containing groove, and wherein the combined containing groove is configured to receive the specimen carrier, and the specimen carrier disposed in the combined containing groove is jointly fixed by the first main body and the second main body.

21. The carrier device according to claim 1, wherein the main body of the carrier device is defined as a first main body, and the containing groove of the carrier device is defined as a first containing groove, wherein the at least one limiting element includes a second main body having a second containing groove that is formed by being recessed on a side of the second main body, and the second main body is configured to rotate relative to the first main body, wherein the first main body further includes a first pivoting portion, and the second main body further includes a second pivoting portion pivotally connected to the first pivoting portion, wherein when the second main body is fixedly disposed on a side of the first main body, the first containing groove is in spatial communication with the second containing groove to jointly form a combined containing groove, and wherein the combined containing groove is configured to receive the specimen carrier, and the specimen carrier disposed in the combined containing groove is jointly fixed by the first main body and the second main body.

22. The carrier device according to claim 1, wherein the main body of the carrier device is defined as a first main body, and the containing groove of the carrier device is defined as a first containing groove, wherein the at least one limiting element includes a second main body having a second containing groove that is formed by being recessed on a side of the second main body, wherein the carrier device further includes a curved structure connected to the first main body and the second main body, and the second main body is configured to rotate relative to the first main body through the curved structure, wherein when the second main body is fixedly disposed on a side of the first main body, the first containing groove is in spatial communication with the second containing groove to jointly form a combined containing groove, and wherein the combined containing groove is configured to receive the specimen carrier, and the specimen carrier disposed in the combined containing groove is jointly fixed by the first main body and the second main body.

23. The carrier device according to claim 1, wherein the main body of the carrier device is defined as a first main body, and the containing groove of the carrier device is defined as a first containing groove, wherein the at least one limiting element includes a second main body having a second containing groove that is formed by being recessed on a side of the second main body, wherein when the second main body is fixedly disposed on a side of the first main body, the first containing groove is in spatial communication with the second containing groove to jointly form a combined containing groove, wherein the combined containing groove is configured to receive the specimen carrier, and the specimen carrier disposed in the combined containing groove is jointly fixed by the first main body and the second main body, wherein the carrier device further includes a processing module fixedly disposed on the second main body and an electrical connection element that is connected to the processing module, wherein the processing module includes a power supply unit configured to store electricity and a control unit that is electrically connected to the power supply unit, wherein the electrical connection element has an end that is opposite to an end thereof that is connected to the processing module, and the specimen carrier has an electrical connection portion and an electronic component, wherein the end the electrical connection element being opposite to the end thereof that is connected to the processing module is configured to be connected to the electrical connection portion of the specimen carrier, and wherein when the specimen carrier is fixedly disposed in the containing groove, and the electrical connection element is connected to the electrical connection portion of the specimen carrier, the power supply unit is configured to provide the electricity needed when the control unit is in operation, and the power supply unit is configured to provide the electricity needed when the electronic component inside of the specimen carrier is in operation.

24. A carrier kit, comprising:
   a specimen carrier having two observation grooves respectively formed by being recessed on two opposite sides thereof and a containing channel that is formed therein and is configured to receive a specimen, each of the two observation grooves being configured to expose a part of the containing channel; and
   a carrier device being configured to be fixedly disposed on a specimen holder of an electron microscope equipment and being configured to carry the specimen carrier, the carrier device including:
      a main body having a containing groove recessed on a side thereof and an observation port that is in spatial communication with the containing groove, wherein the containing groove is configured to receive the specimen carrier, and wherein when the specimen carrier is disposed in the containing groove, one of the observation grooves is exposed from the main body through the observation port; and
      at least one limiting element disposed on the main body, wherein the at least one limiting element is configured to limit a range of movement of the specimen carrier disposed in the containing groove relative to the main body.

* * * * *